(12) United States Patent
Yamada et al.

(10) Patent No.: US 7,541,631 B2
(45) Date of Patent: Jun. 2, 2009

(54) SOLID-STATE IMAGING DEVICE

(75) Inventors: Tohru Yamada, Tokyo (JP); Michiyo Ichikawa, Kyoto (JP); Mamoru Honjo, Osaka (JP); Atsuo Nakagawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 132 days.

(21) Appl. No.: 11/854,077

(22) Filed: Sep. 12, 2007

(65) Prior Publication Data

US 2008/0210983 A1 Sep. 4, 2008

(30) Foreign Application Priority Data

Dec. 8, 2006 (JP) .............................. 2006-332164

(51) Int. Cl.
H01L 31/062 (2006.01)
H01L 31/113 (2006.01)

(52) U.S. Cl. ................. 257/294; 257/435; 257/E27.133

(58) Field of Classification Search ......... 257/291–294, 257/435, E27.133
See application file for complete search history.

(56) References Cited

U.S. PATENT DOCUMENTS 5,796,154 A * 8/1998 Sano et al. .................. 257/432
7,053,427 B2 * 5/2006 Tanigawa .................... 257/294
7,446,356 B2 * 11/2008 Misawa ....................... 257/291

FOREIGN PATENT DOCUMENTS

JP 3-256359 11/1991

* cited by examiner

Primary Examiner—Thien F Tran
(74) Attorney, Agent, or Firm—Hamre, Schumann, Mueller & Larson, P.C.

(57) ABSTRACT

A solid-state imaging device including: a plurality of photodiode parts (1); a plurality of vertical charge transfer parts (2) each of which reads out a signal charge and transfers the signal charge in a vertical direction; and a plurality of shade films (5) that have conductivity, which supplies a transfer pulse via the shade film (5), is used. The vertical charge transfer parts (2) respectively have transfer channels (13) and transfer electrodes (3). The shade film (5) is formed above the corresponding vertical charge transfer part (2) via an insulation layer (21) that insulates the shade film (5) from the transfer electrodes (3). The insulation layer (21) has a thick part (8) in a part of the insulation layer (21) where the shade film (5) is overlapped on a side of the photodiode part (1) that is a subject to be read out by the vertical charge transfer part (2).

10 Claims, 30 Drawing Sheets

A-A'

SOLID-STATE IMAGING DEVICE

BACKGROUND OF THE INVENTION

1. Field of the Invention

The present invention relates to a solid-state imaging device, and particularly relates to a CCD (charge coupled device) type solid-state imaging device.

2. Description of Related Art

Recently, due to the rapid prevalence of digital cameras, digital movie cameras and mobile phones equipped with camera functions, the demands for solid-state imaging devices have been increased rapidly. In particular, in accordance with the demand for the increase of the number of pixels and functions for supporting moving images, the increase of a driving speed of solid-state imaging devices has been desired recently. As one measure for this, for example, JP 3(1991)-256359 A discloses a shunt wiring structure in which a shade film also functions of supplying a transfer pulse to a transfer electrode of a vertical CCD.

A CCD type solid-state imaging device having a shunt wiring structure will be described with reference to FIGS. 24 to 28. Initially, an entire configuration of the solid-state imaging device will be described. FIG. 24 is a structural view schematically showing an entire configuration of a conventional solid-state imaging device having a shunt wiring structure. As shown in FIG. 24, the solid-state imaging device has a semiconductor substrate 101 that is provided with a plurality of pixels 104. The pixels 104 are arranged in matrix, and a region where the pixels 104 are arranged is an image formation region 101a. In this example, a n-type silicone substrate is used as the semiconductor substrate 101 (see FIG. 26).

Each of the pixels 104 has a vertical charge transfer part (vertical CCD (charge coupled device)) 102 and a photodiode part 111. Moreover, on the semiconductor substrate 101, a horizontal charge transfer part (horizontal CCD) 103 is formed along a horizontal direction on a side of a transfer direction of the vertical CCD 102. At an output end of the horizontal CCD 103, an output amplifier 103b is provided. An arrow in FIG. 24 represents a transfer direction of electric charges.

Each of the vertical CCD 102 and the horizontal CCD 103 has a transfer channel that is formed on the semiconductor substrate 101, and a first transfer electrode and a second transfer electrode that are disposed on the transfer channel, which are not illustrated in FIG. 24. It should be noted that, in the present specification, the transfer electrode of the vertical CCD is called a "vertical transfer electrode", and the transfer electrode of the horizontal CCD is called a "horizontal transfer electrode".

In a peripheral region of the image formation region 101a, a vertical bus line part 116 is provided along an outer periphery of the image formation region 101a. The vertical bus line part 116 has a vertical bus line wirings 116a to 116d. To the respective vertical bus line wirings 116a to 116d, different transfer pulses ΦV1 to ΦV4 are supplied externally.

Further, a horizontal bus line part 117 is provided along the horizontal CCD 103. The horizontal bus line part 117 has horizontal bus line wirings 117a and 117b. Also to the respective horizontal bus line wirings 117a and 117b, different transfer pulses ΦH1 and ΦH2 are supplied externally.

Moreover, a stripe-shaped shade film 113 is formed on each vertical CCD 102 so as to cover the vertical CCD 102 such that light is not incident into the vertical CCD 102. The shade film 113 is made of a metal material, and is connected to either of the vertical bus line wirings 116a to 116d. Moreover, the shade film 113 is connected to the vertical transfer electrode via a contact hole 114. Thus, the shade film 113 functions as a shunt wiring that supplies a transfer pulse to the vertical transfer electrode of the vertical CCD 102. It should be noted that a part of the shade film 113 is omitted in FIG. 24.

Next, a configuration of the pixel of the solid-state imaging device shown in FIG. 24 will be described specifically with reference to FIGS. 25 to 28. FIG. 25 is a plan view showing a configuration of a pixel and its periphery of the solid-state imaging device shown in FIG. 24. FIG. 26 is a cross-sectional view taken on line X-X' of FIG. 25. FIG. 27 is a cross-sectional view taken on line Y-Y' of FIG. 25. FIG. 28 is a cross-sectional view taken on line Z-Z' of FIG. 25. Incidentally, the shade film 113 is shown in broken line in FIG. 25. In FIGS. 26 to 28, members that are made of metal materials (except for the semiconductor substrate) are hatched.

As shown in FIGS. 25 and 26, the vertical CCD 102 has a transfer channel 102a, a first vertical transfer electrode 106 and a second vertical transfer electrode 109. A plurality of the transfer channels 102a are formed along respective vertical columns of a plurality of the photodiode parts 111 in a surface layer of the semiconductor substrate 101.

As shown in FIG. 25, the first vertical transfer electrode 106 and the second vertical transfer electrode 109 are formed above the plurality of the transfer channels 102a via a gate insulation film 105 (see FIGS. 26 to 28), so as to cross the plurality of the transfer channels 102a. The shade film 113 is formed in stripe so as to cover the vertical CCD 102. The shade film 113 is connected to the first vertical transfer electrode 106 via a contact hole 114a (see FIG. 27). Moreover, the shade film 113 is connected to the second vertical transfer electrode 109 via a contact hole 114b.

As shown in FIG. 26, the photodiode part 111 has a photoelectric conversion region 111a formed of a n-type diffusion region, and an inversion layer 111d formed above the photoelectric conversion region 111a. Moreover, between the photodiode part 111 and its corresponding vertical CCD 102, a read-out region 111b is formed. A signal charge formed in the photoelectric conversion region 111a is read out to the transfer channel 102a via the read-out region 111b. The read-out region 111b is a p-type diffusion region. Moreover, a pixel isolation region 111c is formed between the photodiode part 111 and a vertical CCD that corresponds to another photodiode part 111 so as to isolate them. The pixel isolation region 111c is a p-type diffusion region that has an impurity concentration higher than that of the read-out region 111b.

Moreover, as shown in FIG. 27, above the transfer channel 102a, the first vertical transfer electrode 106 and the second vertical transfer electrode 109 are arranged adjacent to each other so as to transfer electric charges. Further, the second vertical transfer electrode 109 is formed so that an end thereof is overlapped with an end of the first vertical transfer electrode 106. Whereas, as shown in FIG. 28, on a region where the transfer channel 102a is not formed, the second vertical transfer electrode 109 is disposed on the first vertical transfer electrode 106.

Moreover, in FIGS. 27 and 28, reference numeral 108 denotes an insulation film that is formed on an upper surface and lateral surfaces of the first vertical transfer electrode 106 by thermal oxidation. Reference numeral 112 denotes an insulation film that is formed on an upper surface and lateral surfaces of the second vertical transfer electrode 109 by thermal oxidation. Reference numeral 115 denotes an insulation layer (shade film insulation layer) for insulating the first vertical transfer electrode 106 and the second vertical transfer electrode 109 from the shade film 113. Moreover, as shown in FIG. 27, the contact hole 114a that connects the shade film 113 and the first vertical transfer electrode 106 is formed so as to pierce the insulation film 108 and the shade film insulation layer 115.

Further, an insulation layer 118 is formed so as to cover an entire upper surface of the semiconductor substrate 101 including the shade film 113. The vertical bus line part 116 shown in FIG. 24 is formed on the insulation layer 118, which is not illustrated. Incidentally, the illustration of the insulation layer 118 is omitted in FIG. 26.

Operations of the solid-state imaging device shown in FIGS. 24 to 28 will be described. In the below explanation, FIGS. 24 to 28 will be referred to, as appropriate. Initially, when an optical image is formed on the image formation region 101a of the semiconductor substrate 101, the photoelectric conversion region 111a of each photodiode part 111 performs photoelectric conversion, and accumulates a signal charge according to an intensity of the incident light and an incident time.

In this state, when a high-level voltage VH (10 V to 15 V) is applied to the second vertical transfer electrode 109 via the vertical bus line part 116 and the shade film 113, a potential directly underneath the second vertical transfer electrode 109 becomes high. Thereby, the signal charge accumulated in the photoelectric conversion region 111a of each photodiode part 111 is transferred to the transfer channel 102a of the vertical CCD 102 through the read-out region 111b.

For example, in the example shown in FIG. 25, the second vertical transfer electrode 109 at a center of the figure is connected to the shade film 113 on a right side of the figure via the contact hole 114b. Thus, when the high-level voltage VH is supplied to the shade film 113 on the right side of the figure, the high-level voltage VH is applied to the second vertical transfer electrode 109 at the center of the figure. As a result, all of the photoelectric conversion regions 111a shown in FIG. 26 start reading out the accumulated signal charges.

Next, a middle-level volgate VM (0 V) and a low-level voltage VL (−5 V to −10 V) are applied alternately to the first vertical transfer electrode 106 and the second vertical transfer electrode 109. Thereby, the signal charges are transferred sequentially in the vertical direction, and reach the horizontal CCD 103.

Thereafter, a high-level voltage (2 V to 5 V) and a low-level voltage (0 V) are applied alternately to a first horizontal transfer electrode (not illustrated) and a second horizontal transfer electrode (not illustrated) of the horizontal CCD 103, via the horizontal bus line part 117. Thereby, the signal charge is transferred from the horizontal CCD 103 to the output amplifier 103b.

The output amplifier 103b converts the signal charge into a voltage, and outputs the signal voltage to the outside. As described above, the signal charge accumulated in the photoelectric conversion region 111a is transferred in the vertical direction by the vertical CCD 102, and is transferred in the horizontal direction by the horizontal CCD 103, thereafter being output to the outside.

By the way, in the solid-state imaging device having the shunt wiring structure, when a voltage is applied to the shade film 113, an electric field is generated thereby. Then, the photodiode part 111 is influenced by the electric field generated by the shade film 113 that is positioned on a read-out side. More specifically, this electric field is stronger as the voltage applied to the shade film 113 is higher. And, as the electric field is stronger, a read-out path from the photodiode part 111 to the vertical CCD 102 is nearer to an interface. As a result, the number of electrons that are trapped in an interface state is increased at the time of the read out, and an output value from this photodiode part is decreased.

For example, in FIG. 26, since the voltage VH is supplied to the shade film 113 on the right side of the figure, the shade film 113 on the right side of the figure generates a strong electric field. Thus, as shown in FIG. 26, in the photodiode part 111 on the right side of the figure, where the shade film 113 on the right side of the figure is positioned on the read-out side, the read-out path is near to the interface, and many electrons are trapped in the interface state.

Whereas, in FIG. 26, since the voltage VL is applied to the shade film 113 on the left side of the figure, an electric field generated by the shade film 113 on the left side of the figure has a polarity opposite to a polarity of the electric field that is generated by the shade film 113 on the right side of the figure. Thus, as shown in FIG. 26, the read-out path of the photodiode part 111 at the center of the figure is positioned deeper than the photodiode part 111 on the right side of the figure, and the number of electrons that are trapped in the interface state also is smaller.

As a result, the output value from the photodiode part 111 at the center of the figure is larger than the output value from the photodiode part 111 on the right side of the figure, and unwanted vertical stripes are displayed on a display, thereby degrading the image quality of a shot image.

SUMMARY OF THE INVENTION

Therefore, with the foregoing in mind, it is an object of the present invention to solve the above described problems, and to provide a solid-state imaging device that decreases the influence on the photodiode part by the electric field generated by the shade film, and can suppress the degradation of the image quality of the shot image due to the unwanted vertical stripes.

In order to attain the above-mentioned object, the solid-state imaging device of the present invention is a solid-state imaging device including: a plurality of photodiode parts, each of which converts incident light into a signal charge; a plurality of vertical charge transfer parts, each of which reads out the signal charge from the photodiode part and transfers the signal charge in a vertical direction; and a plurality of shade films that have conductivity and respectively shade the vertical charge transfer part from the incident light, the solid-state imaging device supplying a transfer pulse to the vertical charge transfer part via the shade film. The plurality of the photodiode parts are provided on a semiconductor substrate and are arranged in matrix. Each of the plurality of the vertical charge transfer parts includes a transfer channel that is provided along a vertical column of the plurality of the photodiode parts in the semiconductor substrate, and a plurality of transfer electrodes that are provided on the transfer channel so as to cross the transfer channel. Each of the plurality of the shade films is formed above each of the corresponding vertical charge transfer parts via an insulation layer that insulates the shade film from the transfer electrodes. The insulation layer has a thick part in a part of the insulation layer where the shade film is overlapped on a side of the photodiode part that is a subject to be read out by the vertical charge transfer part shaded by the shade film, and a lens element that is convex downwards is provided above the plurality of the photodiode parts, for each of the plurality of the photodiode parts or each of the vertical columns of the plurality of the photodiode parts.

As described above, in the solid-state imaging device of the present invention, the thick part of the insulation layer enlarges a distance between the shade film and the transfer electrode and a distance between the shade film and the semiconductor substrate in the region on the read-out side of the photodiode part so as to be longer than those in other region. Thus, the influence on the photodiode part by the electric field generated by the shade film can be decreased, thereby suppressing the change of the read-out path depending on the voltage that is applied to the shade film. Thus, according to the solid-state imaging device of the present invention, the generation of the unwanted vertical stripes on the shot image can be suppressed, and as a result, the degradation of the image quality of the shot image can be suppressed.

These and other advantages of the present invention will become apparent to those skilled in the art upon reading and understanding the following detailed description with reference to the accompanying figures.

BRIEF DESCRIPTION OF THE DRAWINGS

FIG. 4 is a cross-sectional view showing a method for manufacturing the solid-state imaging device according to Embodiment 1 of the present invention.

FIG. 5 is a cross-sectional view showing the method for manufacturing the solid-state imaging device according to Embodiment 1 of the present invention.

FIG. 7 is a cross-sectional view showing a method for manufacturing the solid-state imaging device according to Embodiment 2 of the present invention.

FIG. 8 is a cross-sectional view showing the method for manufacturing the solid-state imaging device according to Embodiment 2 of the present invention.

FIG. 10 is a cross-sectional view showing a method for manufacturing the solid-state imaging device according to Embodiment 3 of the present invention.

FIG. 11 is a cross-sectional view showing the method for manufacturing the solid-state imaging device according to Embodiment 3 of the present invention.

FIG. 14 is a cross-sectional view showing a method for manufacturing the solid-state imaging device according to the first example of Embodiment 4 of the present invention.

FIG. 15 is a cross-sectional view showing the method for manufacturing the solid-state imaging device according to the first example Embodiment 4 of the present invention.

FIG. 21 is a cross-sectional view showing a method for manufacturing the solid-state imaging device according to the first example of Embodiment 5 of the present invention.

FIG. 22 is a cross-sectional view showing the method for manufacturing the solid-state imaging device according to the first example of Embodiment 5 of the present invention.

DETAILED DESCRIPTION OF THE INVENTION

Figure 1:
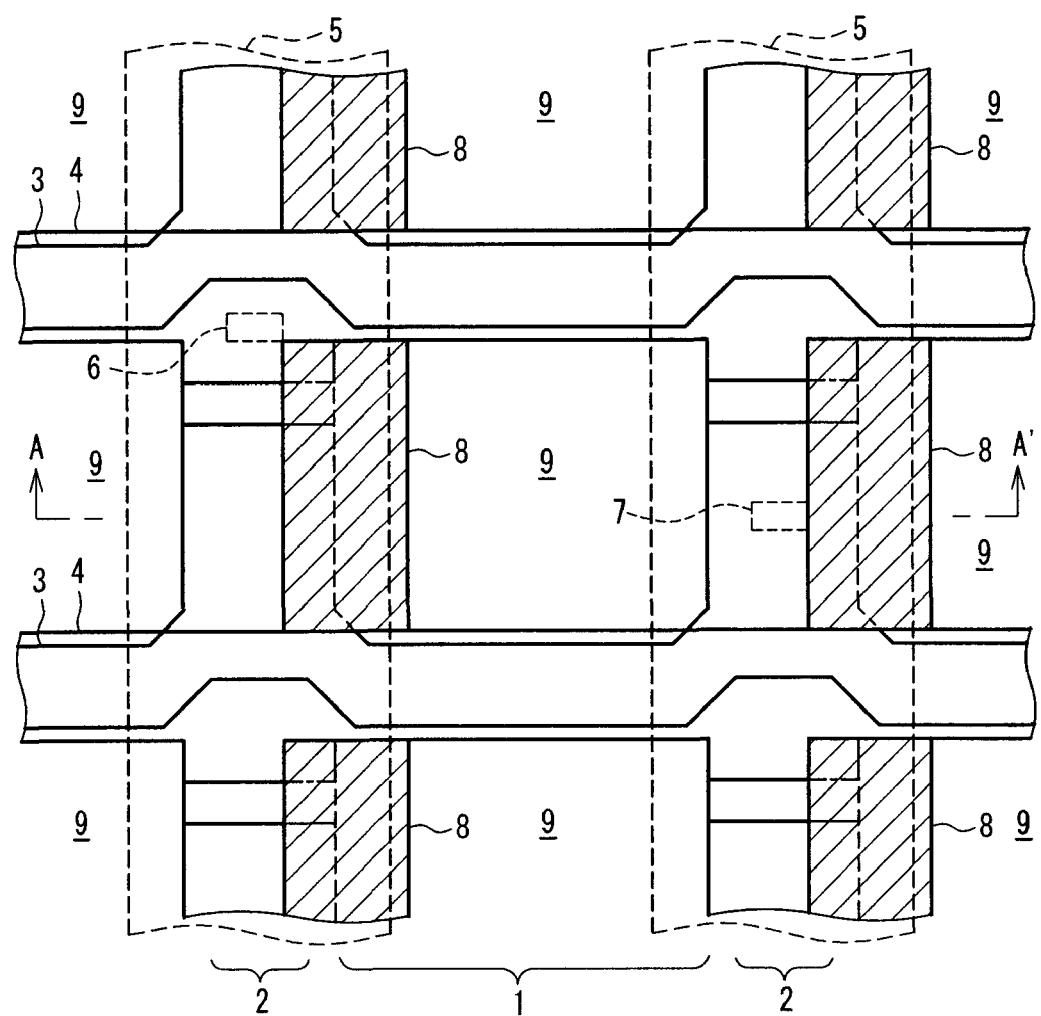
FIG. 1 is a plan view showing a configuration of a pixel and its periphery of a solid-state imaging device according to Embodiment 1 of the present invention.

The solid-state imaging device of the present invention is a solid-state imaging device including: a plurality of photodiode parts, each of which converts incident light into a signal charge; a plurality of vertical charge transfer parts, each of which reads out the signal charge from the photodiode part and transfers the signal charge in a vertical direction; and a plurality of shade films that have conductivity and respectively shade the vertical charge transfer part from the incident light, the solid-state imaging device supplying a transfer pulse to the vertical charge transfer part via the shade film. The plurality of the photodiode parts are provided on a semiconductor substrate and are arranged in matrix. Each of the plurality of the vertical charge transfer parts includes a transfer channel that is provided along a vertical column of the plurality of the photodiode parts in the semiconductor substrate, and a plurality of transfer electrodes that are provided on the transfer channel so as to cross the transfer channel. Each of the plurality of the shade films is formed above each of the corresponding vertical charge transfer parts via an insulation layer that insulates the shade film from the transfer electrodes. The insulation layer has a thick part in a part where the shade film is overlapped on a side of the photodiode part that is a subject to be read out by the vertical charge transfer part shaded by the shade film, and a lens element that is convex downwards is provided above the plurality of the photodiode parts, for each of the plurality of the photodiode parts or each of the vertical columns of the plurality of the photodiode parts.

In the above-described solid-state imaging device of the present invention, it is possible that the insulation layer includes single insulation film that has a first part and a second part whose thickness is larger than a thickness of the first part, and the second part serves as the thick part (first case). According to the first case, an increase of the manufacturing steps can be suppressed to be minimum, so that an increase of the manufacturing cost also can be suppressed to be minimum.

In the above-described solid-state imaging device of the present invention, it also is possible that the insulation layer includes a first insulation film and a second insulation film. The first insulation film is formed in a region where the shade film is overlapped on the side of the photodiode part that is the subject to be read out by the vertical charge transfer part shaded by the shade film. The second insulation film is formed so as to cover the first insulation film, and the first insulation film and a part of the second insulation film where the first insulation film is overlapped serve as the thick part (second case). According to the second case, variations of a film thickness of the thick part can be suppressed, so that image quality of a shot image can be improved further.

In the second case, in the solid-state imaging device of the present invention, it is preferable that the first insulation film is a silicon nitride film, and is formed so as to cover a photoreceptive region of the photodiode part that is the subject to be read out by the vertical charge transfer part shaded by the shade film (third case). According to the third case, the first insulation film functions as an antireflection film of a photoelectric conversion part. Thus, the sensitivity of the solid-state imaging device can be improved. Further, in the third case, the first insulation film may be formed also on a pixel isolation side of the photodiode part whose photoreceptive region is covered with the first insulation film. Thereby, reflection of light can be suppressed in the entire photoreceptive region, and a sensitivity of the photodiode part can be improved further, so that the image quality of the shot image can be improved further.

Moreover, in the third case, in the case where the first insulation film functions as the antireflection film, it is preferable that the first insulation film is formed such that an outer shape of the thick part is a strip shape extending in the vertical direction when the thick part is seen from an upside of the semiconductor substrate, and covers a region between the photodiode parts that are adjacent to each other in the vertical direction.

For example, if the shade film is formed by etching, a residue of etching of a material of the shade film may be generated due to a step difference of the transfer electrode, in a region between the photoelectric conversion parts that are adjacent to each other in the vertical direction. This residue of the etching may cause a short circuit between the transfer electrodes, inhibit the normal supply of the transfer pulse, and cause a transfer failure of the signal charge. However, according to the above-described configuration, the generation of this residue of etching can be suppressed. Also, as a result, the degradation of the image quality of the shot image also can be suppressed.

Further, in the above-described cases, it is preferable that the outer shape of the thick part is a strip shape with a notch on a periphery. Thereby, it becomes easier to supply hydrogen to an interface state by hydrogen sinter (heat treatment), so that generation of a dark current can be suppressed.

Moreover, the solid-state imaging device of the present invention preferably has an underlying insulation layer that covers an upper surface of the semiconductor substrate including the plurality of the shade films; and a lens formation layer that is formed above the underlying insulation layer, and the underlying insulation layer is provided with a plurality of concave curved surface parts of the underlying insulation layer at positions where the plurality of the photodiode parts are overlapped, the lens formation layer is provided with a convex part that conforms to the plurality of the concave curved surface parts, and the convex part functions as the lens element.

In the above-described case, it also is possible that a step difference adjusting film is formed in a region where the shade film is overlapped on the underlying insulation layer, an intermediate layer is formed so as to cover the step difference adjusting film, and the lens formation layer is formed on the intermediate layer. Thereby, specifications of the lens element can be set easily by changing a size and a shape of the step difference adjusting film, so that an optimum lens shape can be obtained easily. Also, in the above case, it also is possible that an insulation layer that covers an upper surface of the semiconductor substrate including the plurality of the shade films is formed, and is etched so as to form the underlying insulation layer.

Embodiment 1

A solid-state imaging device according to Embodiment 1 of the present invention and its manufacturing steps will be described below with reference to FIGS. 1 to 5. Initially, a specific configuration of the solid-state imaging device of Embodiment 1 will be described with reference to FIGS. 1 to 3.

Figure 2:
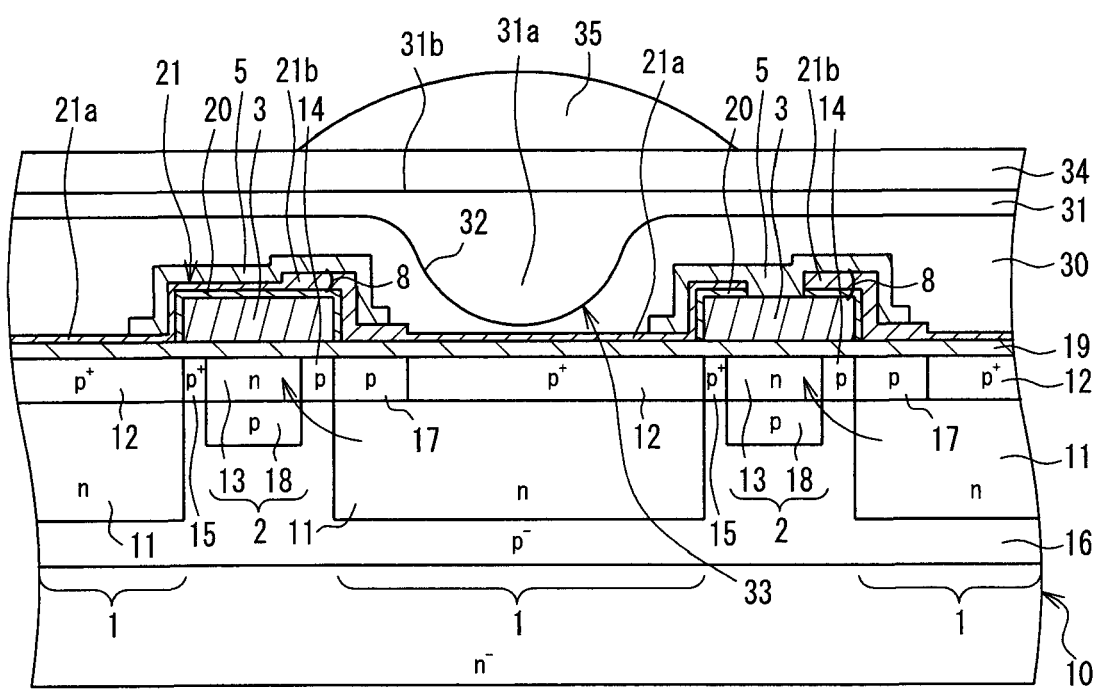
FIG. 2 is a cross-sectional view taken on line A-A' of FIG. 1.
Figure 3:
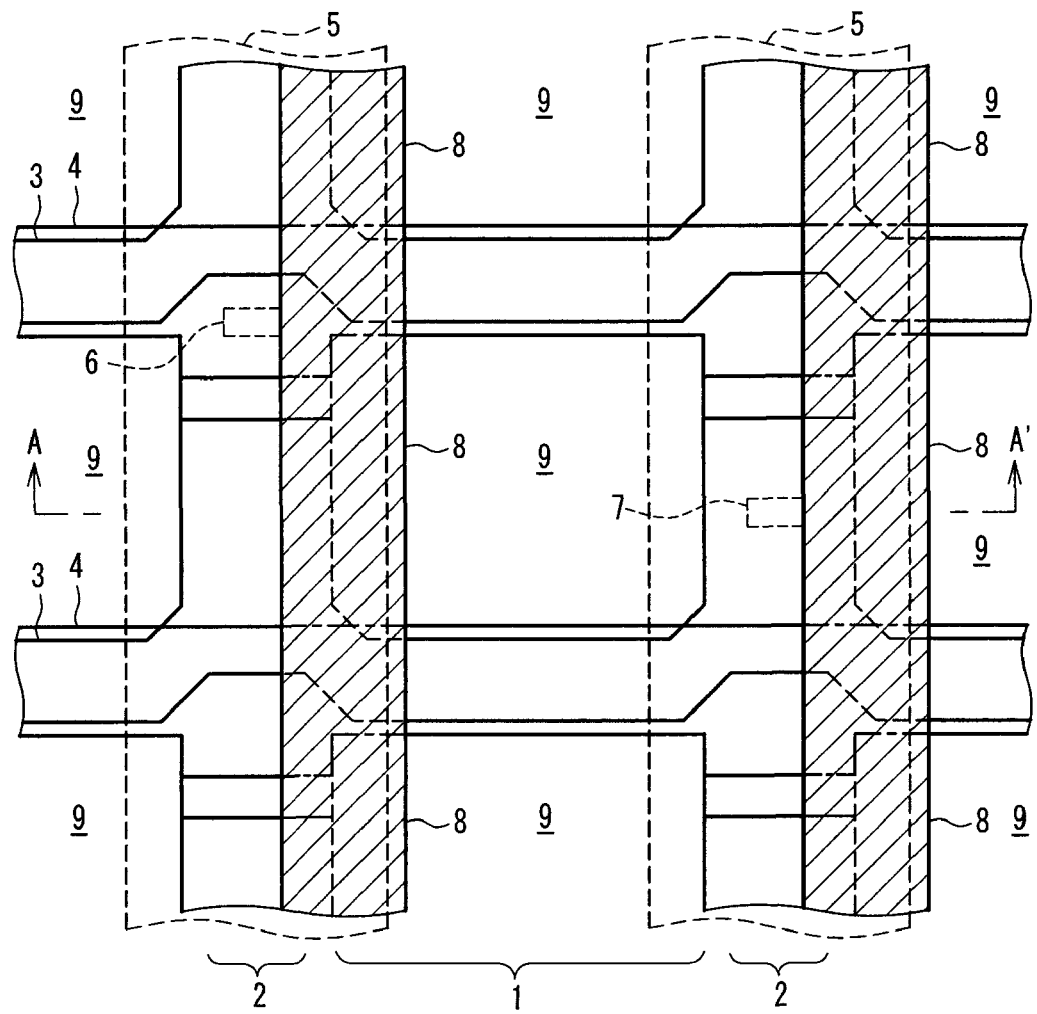
FIG. 3 is a plan view showing a configuration of a pixel and its periphery of a solid-state imaging device according to another example of Embodiment 1 of the present invention.

FIG. 1 is a plan view showing a configuration of a pixel and its periphery of a solid-state imaging device according to Embodiment 1 of the present invention. FIG. 2 is a cross-sectional view taken on line A-A of FIG. 1. FIG. 3 is a plan view showing a configuration of a pixel and its periphery of a solid-state imaging device according to another example of Embodiment 1 of the present invention.

In FIGS. 1 and 3, a shade film 5 is shown in broken line, and a region for forming a thick part 8 is hatched. Moreover, in FIGS. 1 and 3, description of insulating members except for the thick part 8 is omitted. Further, in FIG. 2, the hatching of an inside of a semiconductor substrate 10 and an upper layer of the shade film 5 is omitted.

As shown in FIGS. 1 and 2, the solid-state imaging device of Embodiment 1 has a plurality of photodiode parts 1 and a plurality of vertical charge transfer parts 2, similarly to the conventional solid-state imaging device shown in FIGS. 24 to 28 in the background art (hereinafter, called a "conventional example").

The photodiode part 1 is provided on the semiconductor substrate 10 (see FIG. 2), and converts incident light into a signal charge. Moreover, the plurality of the photodiode parts 1 are arranged in matrix. The vertical charge transfer parts 2 respectively are formed along vertical columns of the photodiode parts 1, read out the signal charges from the corresponding photodiode parts 1, and transfer them in the vertical direction. In Embodiment 1, the semiconductor substrate 10 is a n-type silicon substrate. Moreover, a p-type well 16 is formed on the semiconductor substrate 10.

More specifically, as shown in FIG. 2, the photodiode part 1 has a photoelectric conversion region 11 that is formed of a n-type diffusion region and an inversion layer 12 that is formed above the photoelectric conversion region 11, similarly to the conventional example. Moreover, a read-out region 14 is formed between the photodiode part 1 and its corresponding vertical charge transfer part 2.

The signal charge formed in the photoelectric conversion region 11 is read out to a transfer channel 13 of the vertical charge transfer part 2 via the read-out region 14. The read-out region 14 is a p-type diffusion region. Moreover, as shown in FIG. 2, a p-type diffusion region 17 whose impurity concentration is lower than an impurity concentration of the inversion layer 12 is formed between the inversion layer 12 and the read-out region 14, in order to suppress the generation of a dark current from an interface and enhance ease of read-out.

Further, a pixel isolation region 15 is formed between the photodiode part 1 and the vertical charge transfer part 2 that corresponds to another photodiode part 1, in order to isolate them. The pixel isolation region 15 is a p-type diffusion region whose impurity concentration is higher than an impurity concentration of the read-out region 14, Moreover, as shown in FIG. 2, the vertical charge transfer part 2 has a transfer channel 13, a second vertical transfer electrode 3 and a first vertical transfer electrode 4 (see FIG. 1), similarly to the conventional example. The transfer channel 13 is provided in a surface layer of the semiconductor substrate 10 along each of the vertical columns of the photodiode parts 1. Moreover, the second vertical transfer electrode 3 and the first vertical transfer electrode 4 are configured similarly to those of the conventional example, which are provided on the semiconductor substrate 10 via a gate insulation film 19 so as to cross the transfer channel 13.

In Embodiment 1, the transfer channel 13 is a n-type diffusion region. Moreover, as shown in FIG. 2, a p-type diffusion region 18 is formed below the transfer channel 13 in order to isolate the transfer channel 13 and the semiconductor substrate 10 electrically.

Figure 24:
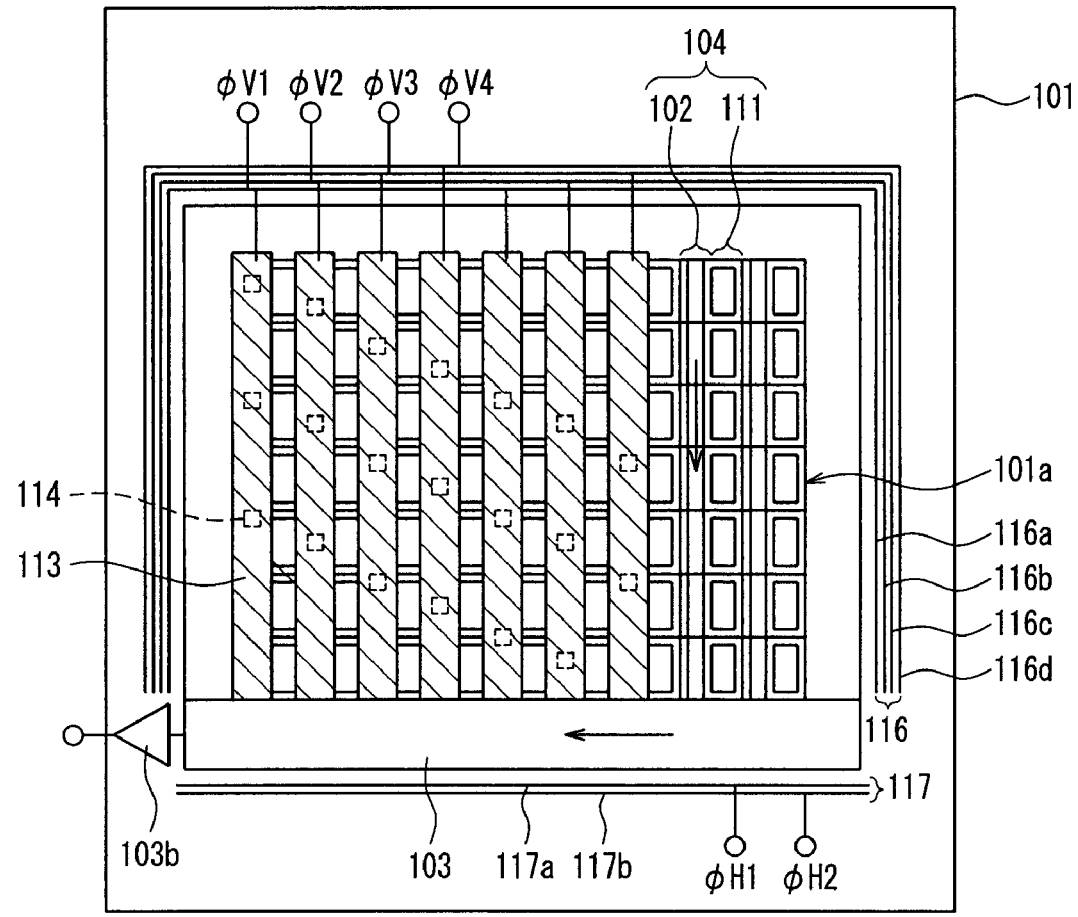
FIG. 24 is a structural view schematically showing an entire configuration of a conventional solid-state imaging device having a shunt wiring structure.
Figure 25:
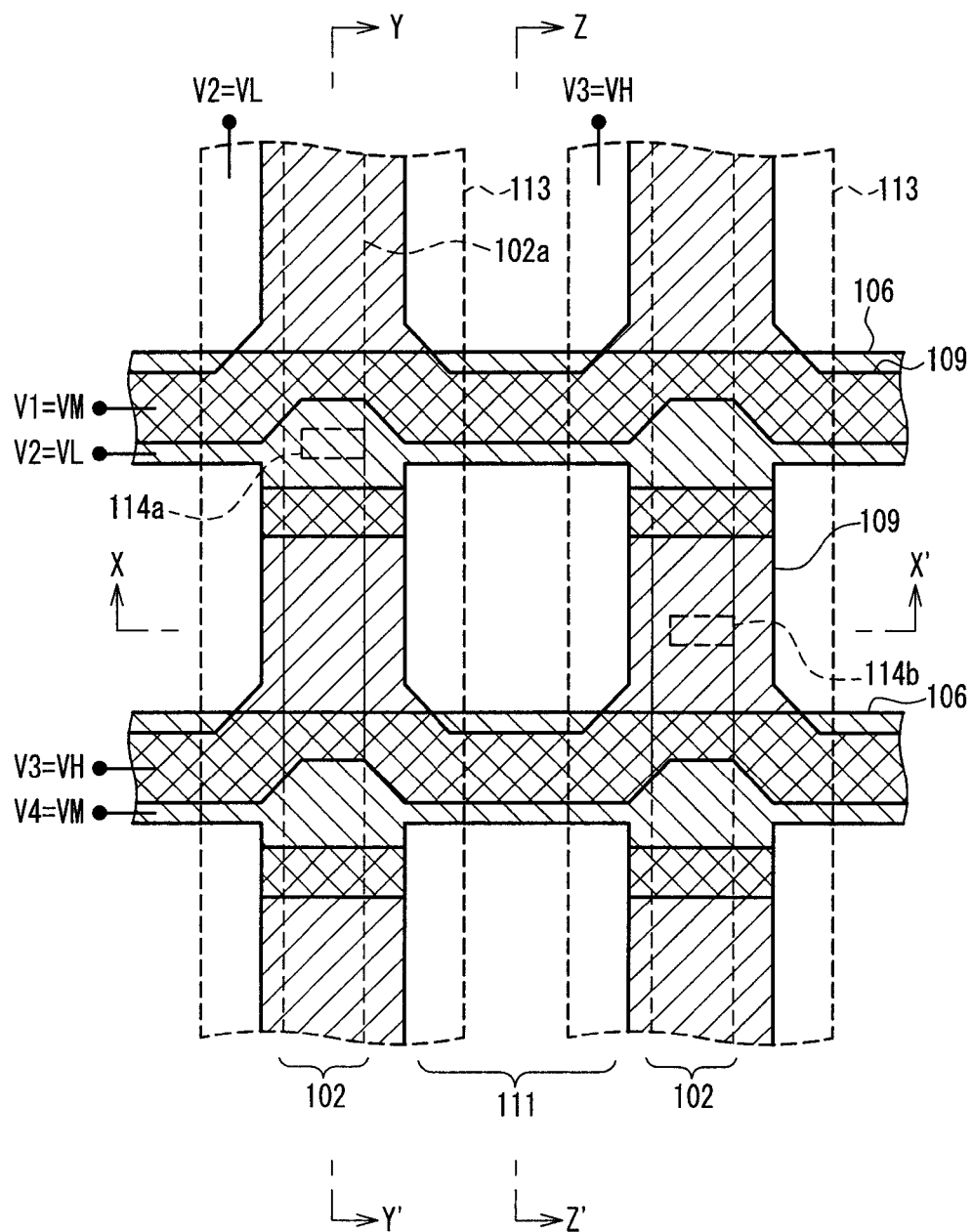
FIG. 25 is a plan view showing a configuration of a pixel and its periphery of the solid-state imaging device shown in FIG. 24
Figure 26:
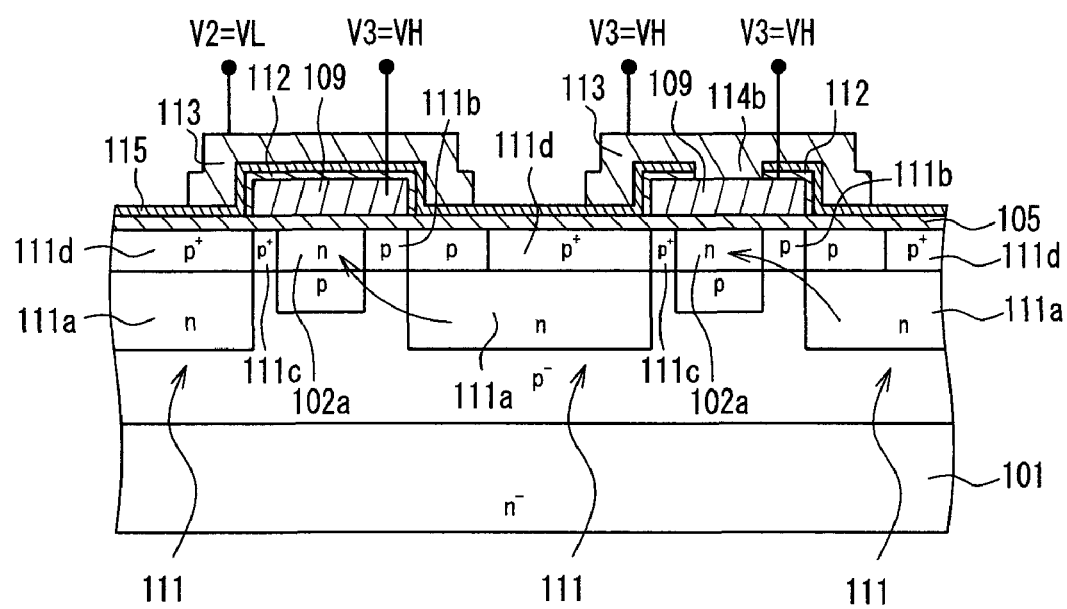
FIG. 26 is a cross-sectional view taken on line X-X' of FIG. 25.
Figure 27:
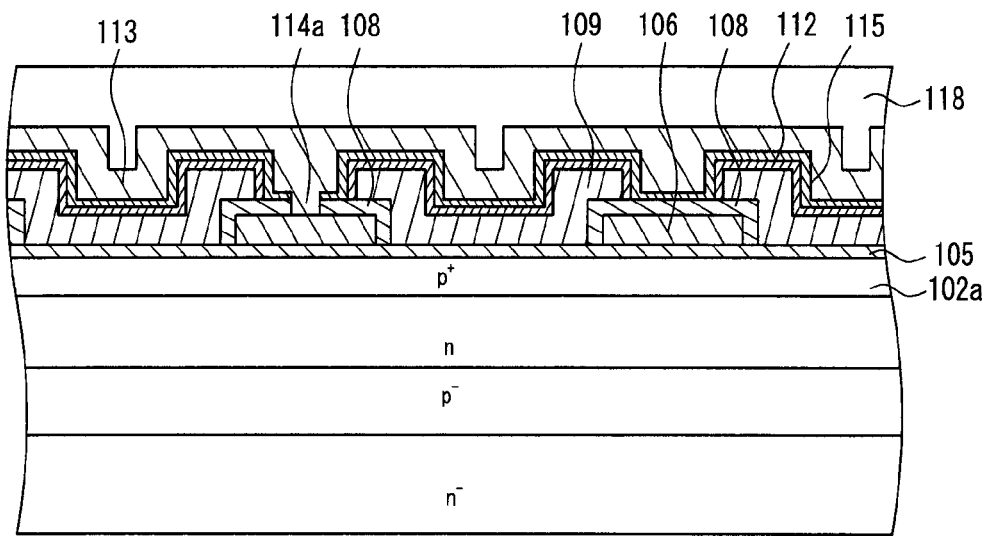
FIG. 27 is a cross-sectional view taken on line Y-Y' of FIG. 25.

The solid-state imaging device of Embodiment 1 also has a horizontal charge transfer part, which is not illustrated in FIGS. 1 and 2, similarly to the conventional example (see. FIG. 24). When the signal charge transferred by the vertical charge transfer part reaches the horizontal charge transfer part, the signal charge is transferred in the horizontal direction by the horizontal charge transfer part, and subsequently is output to the outside via an output amplifier (see FIG. 24).

Moreover, as shown in FIGS. 1 and 2, the solid-state imaging device of Embodiment 1 has a plurality of the shade films 5, each of which shades each vertical charge transfer part 2 from incident light, similarly to the conventional example. The shade film 5 exhibits conductivity, and is connected to the bus line part similarly to the conventional example shown in FIG. 24. Further, the shade film 5 is connected to the second vertical transfer electrode 3 via a contact hole 7, and is connected to the first vertical transfer electrode 4 via a contact hole 6. Moreover, a photoreceptive region 9 of the photodiode part 1 is formed between the two adjacent shade films 5.

As described above, also in Embodiment 1, the shade film 5 functions as a shunt wiring, and the transfer pulse from the bus line part (not illustrated) is supplied to the vertical charge transfer part 2 via the shade film 5. Thus, an electric field is generated by the shade film 5 also in Embodiment 1 similarly to the conventional example, but an influence of the electric field on the photodiode part 1 is suppressed in Embodiment 1. This point will be described below.

Similarly to the conventional example, an insulation film (silicon oxide film) 20 is formed on an upper surface and lateral surfaces of the second vertical transfer electrode 3 (see FIG. 2), and an insulation film (not illustrated) is formed also on an upper surface and lateral surfaces of the first vertical transfer electrode 4. Further, similarly to the conventional example, the shade film 5 is formed above the corresponding vertical charge transfer part 2 via an insulation layer 21 that insulates the shade film 5 from the second vertical transfer electrode 3 and the first vertical transfer electrode 4.

It should be noted that, in Embodiment 1, the insulation layer 21 has the thick part 8 in its part where the shade film 5 is overlapped on a side of the photodiode part 1 that is a subject to be read out by the vertical charge transfer part 2 shaded by this shade film 5. More specifically, the insulation layer 21 is a single layer, and is constituted of an insulation film that has a first part 21a and a second part 21b whose thickness is larger than a thickness of the first part 21a, where the second part 21b serves as the thick part 8.

As described above, in Embodiment 1, since the thick part 8 is formed, the electric field generated by the shade film 5 is weakened by the thick part 8, so that the influence of the electric field that is exerted on the photodiode part 1 from the read-out side is decreased. Thus, in Embodiment 1, since the change of the read-out path according to the voltage applied to the shade film 5 is suppressed, the generation of the unwanted vertical stripes on the shot image also can be suppressed.

Moreover, in Embodiment 1, where a thickness of the first part 21a is represented by t1 and a thickness of the second part 21b is represented by t2, it is preferable to set the thickness t2 within a range from 1.5×t1 to 3×t1, from the standpoint of suppressing the generation of the unwanted vertical stripes reliably. More specifically, for example, in the case where the thickness t1 of the first part 21a is set to be 50 nm, the thickness t2 of the second part 21b can be set to be about 100 nm. Further, a horizontal width of the thick part 8 preferably is set such that the thick part 8 is not overlapped with the contact holes 6 and 7, but is overlapped with an end of the shade film 5 on the read-out side, even if a positional displacement occurs in the horizontal direction due to variations of processing.

Further, in Embodiment 1, a pattern shape of the thick part 8, that is, an outer shape of the thick part 8 when being seen from the upside of the semiconductor substrate 1 is not limited particularly. As shown in FIG. 3, the pattern shape of the thick part 8 also may be a stripe shape that extends in the vertical direction.

Moreover, as shown in FIG. 2, the solid-state imaging device of Embodiment 1 has a lens element 33 that is convex downwards, above each of the plurality of the photodiode parts 1.

More specifically, the solid-state imaging device has an underlying insulation layer 30 that covers the upper surface of the semiconductor substrate 10 including the plurality of the shade films 5, and a lens formation layer 31 that is formed thereon. The underlying insulation layer 30 has a hemispherical concave curved surface part 32 at a position where each of the photodiode parts 1 is overlapped. The lens formation layer 31 has a convex part 31a that conforms to each of the concave curved surface parts 32, and a flattened upper surface 31b.

According to this configuration, the convex part 31a serves as the lens element 33 that is convex downwards, and condenses the incident light to the photodiode part 1. Incidentally, the lens element 33 may be formed in each of the vertical columns of the plurality of the photodiode parts 1. In this case, a shape of the lens element 33 is not the hemispherical shape but a semicylindrical shape. Moreover, in FIG. 2, reference numeral 34 denotes a color filter, and 35 denotes a microlens.

Next, manufacturing steps of the solid-state imaging device according to Embodiment 1 will be described with reference to FIGS. 4 and 5. FIGS. 4 and 5 are cross-sectional views showing a method for manufacturing the solid-state imaging device according to Embodiment 1 of the present invention. FIGS. 4A to 4D respectively show a sequence of main manufacturing steps. FIGS. 5A and 5B respectively show a sequence of main manufacturing steps that are performed after the step shown in FIG. 4D.

Figure 4A:
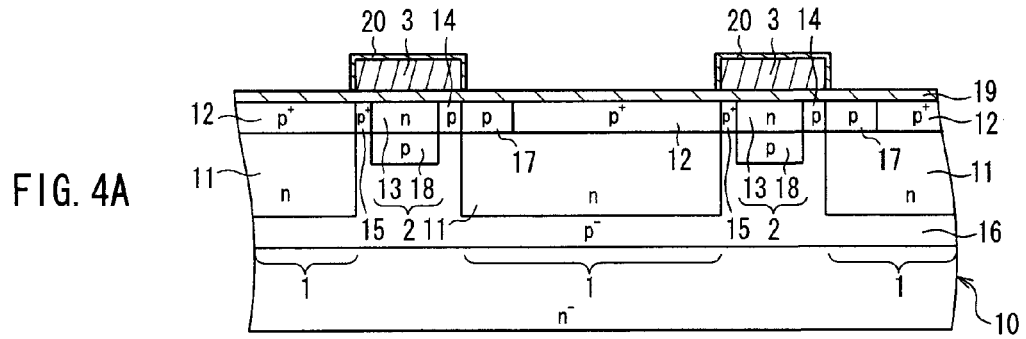
FIGS. 4A to 4D respectively show a sequence of main manufacturing steps.

Initially, as shown in FIG. 4A, various kinds of ion-implantation are performed with respect to the semiconductor substrate 10 so as to form respective semiconductor regions, and further, the second vertical transfer electrode 3 and the first vertical transfer electrode 4 (not illustrated in FIG. 4) also are formed of polysilicon films. Further, the insulation film (not illustrated in FIG. 4) that covers the upper surface and the lateral surfaces of the first vertical transfer electrode 4, and the insulation film (silicon oxide film) 20 that covers the upper surface and the lateral surfaces of the second vertical transfer electrode 3 also are formed by thermal oxidation.

Figure 4B:
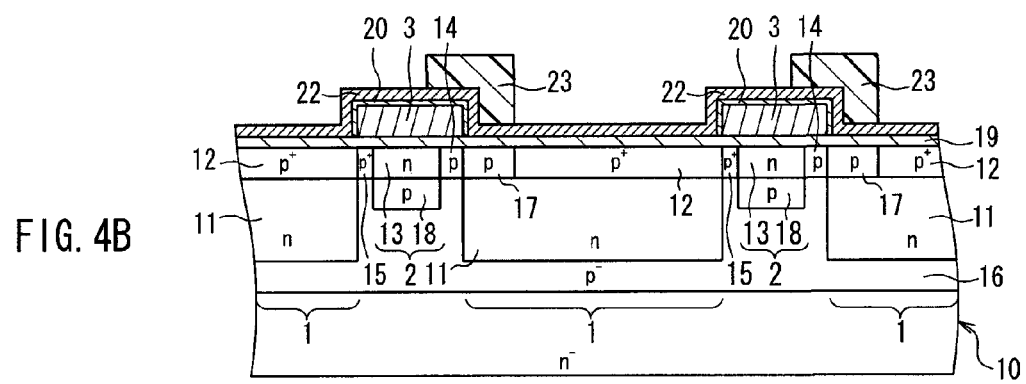
Figure 5A:
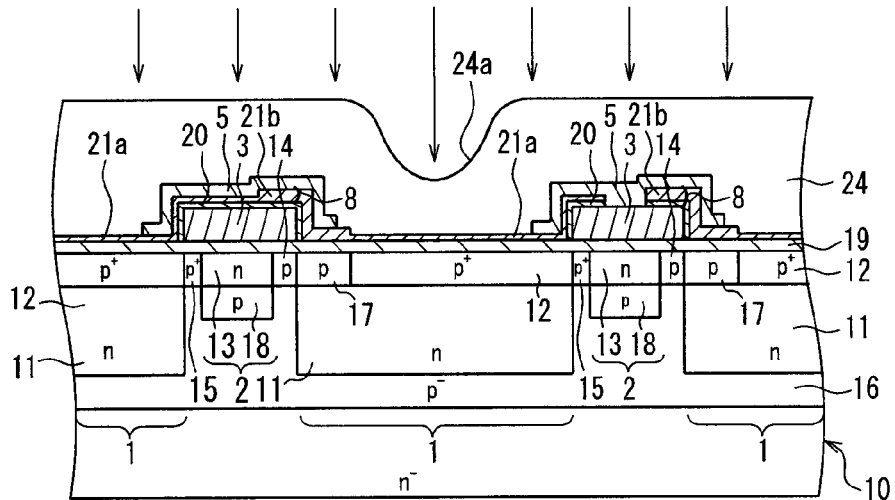
FIGS. 5A and 5B respectively show a sequence of main manufacturing steps that are performed after the step shown in FIG. 4D.
Figure 5B:
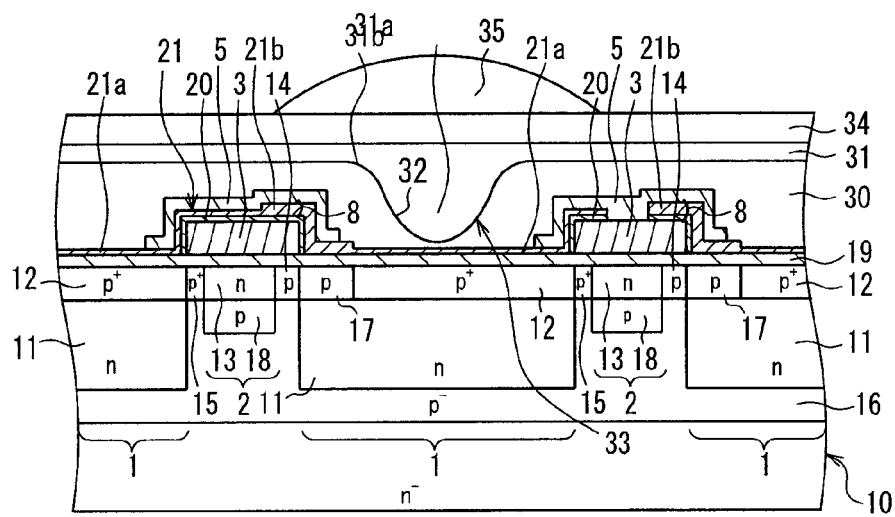

Next, as shown in FIG. 4B, an insulation film 22 that covers an entire upper surface of the semiconductor substrate 10 including the second vertical transfer electrode 3 and the first vertical transfer electrode 4 is formed. More specifically, a silicon oxide film is formed by utilizing low pressure CVD (chemical vapor deposition). At this time, a thickness of the insulation film 22 is set within a range from 20 nm to 200 nm, for example. Thereafter, a resist pattern 23 that covers the region for forming the thick part 8 is formed.

Figure 4C:
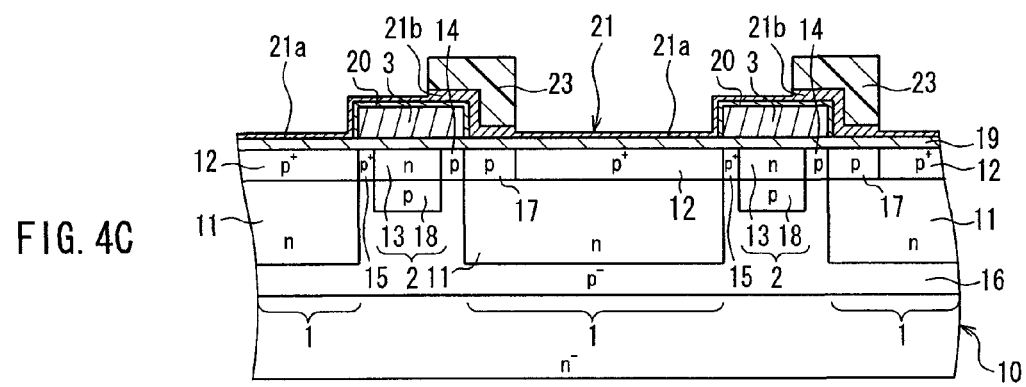

Next, as shown in FIG. 4C, the insulation film 22 is etched until the thickness of a part where the resist pattern 23 does not cover becomes the set value t1. More specifically, an etching time is obtained from an expected etching speed and a target etching amount, and the etching is carried out for the obtained etching time. Thereby, the insulation layer 21 having the first part 21a and the second part 21b is obtained. Moreover, the thick part 8 having the outer shape shown in FIG. 1 (or FIG. 3) is formed.

As described above, in Embodiment 1, the thick part 8 can be formed in one etching process. Thus, an increase of the manufacturing steps of the solid-state imaging device can be suppressed, and an increase of a manufacturing cost can be suppressed to be minimum.

Figure 4D:
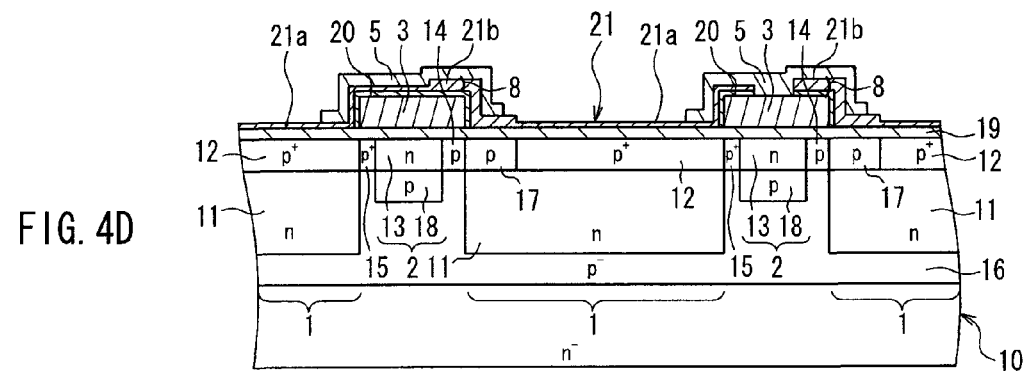

Next, as shown in FIG. 4D, the shade film 5 exhibiting conductivity is formed. More specifically, after forming a conductive film by CVD, sputtering or the like, and forming a resist pattern (not illustrated) that covers the region for forming the shade film, the shade film 5 is formed by etching.

Next, as shown in FIG. 5A, an insulation film 24 serving as the underlying insulation layer 30 (see FIG. 2) is formed. More specifically, a BPSG (boron phosphorous silicate glass) film is formed by CVD. Next, the insulation film 24 is subjected to reflowing by heat treatment, and a concave part 24a that has a smooth curved surface is formed in a region of the insulation film 24 where the photoreceptive region 9 is overlapped. Subsequently, the etching (represented by the arrow in FIG. 5A) is carried out until the thickness of the insulation film 24 and a distance between an apex of the concave part 24a and the insulation layer 21 become set values. Thereby, the concave curved surface part 32 (see FIG. 5B) for shaping the lens element 33 is formed so as to complete the underlying insulation layer 30.

It should be noted that, in a step shown in FIG. 5A, a shape and a size of the concave curved surface part 32 (concave part 24a) for shaping the lens element 33 are controlled by the reflowing and the etching, but Embodiment 1 is not limited to this. For example, the shape and the size of the concave curved surface part 32 can be controlled also by concentrations of boron and phosphorous in the BPSG film constituting the insulation film 24, and further, by adjusting a heat treatment time, a film thickness of the insulation film 24 or the like. Even the thus obtained lens element 33 can improve an light condensing efficiency, similarly to the lens element 33 that is obtained by the reflowing and the etching. Incidentally, by the reflowing and the etching, a distance between a peak of the lens element 33 and the insulation layer 21 can be decreased easily. Moreover, the peak of the lens element 33 may be in contact with the insulation layer 21.

Thereafter, as shown in FIG. 5B, the insulation film in which the concave curved surface part 32 (concave part 24a) is buried is formed, and this insulation film is subjected to flattening treatment, thereby completing the lens formation layer 31 and the lens element 33. More specifically, for example, after forming the silicon nitride film by the CVD, the insulation film is flattened by CMP or by etching back after the formation of the resist. Then, the color filter 34 and the microlens 35 are formed in this order on the lens formation layer 31, thereby obtaining the solid-state imaging device of Embodiment 1.

Embodiment 2

Figure 6:
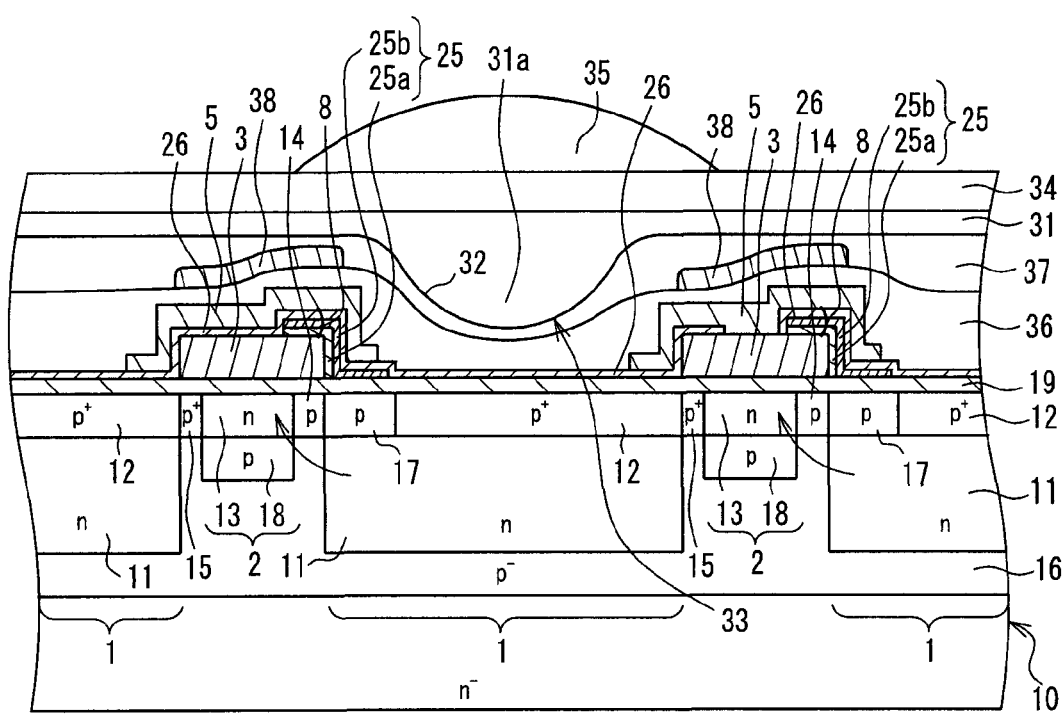
FIG. 6 is a cross-sectional view showing a configuration of a pixel and its periphery of a solid-state imaging device according to Embodiment 2 of the present invention.

Next, a solid-state imaging device according to Embodiment 2 of the present invention and its manufacturing steps will be described below with reference to FIGS. 6 to 8. Initially, a specific configuration of the solid-state imaging device of Embodiment 2 will be described with reference to FIG. 6. FIG. 6 is a cross-sectional view showing a configuration of a pixel and its periphery of a solid-state imaging device according to Embodiment 2 of the present invention. In FIG. 6, the hatching of the inside of the semiconductor substrate 10 and the upper layer of the shade film 5 is omitted.

The solid-state imaging device of Embodiment 2 is different from the solid-state imaging device of Embodiment 1 in the configurations of the thick part 8 and the lens element 33. Except for these points, the solid-state imaging device of Embodiment 2 is configured similarly to the solid-state imaging device of Embodiment 1. The differences between Embodiments 1 and 2 will be described below.

As shown in FIG. 6, in Embodiment 2, unlike Embodiment 1, a partial insulation film 25 is formed in a region where the shade film 5 is overlapped on the side of the photodiode part 1 that is the subject to be read out by the vertical charge transfer part 2 shaded by this shade film 5. Further, an insulation film 26 that insulates the shade film 5 from the second vertical transfer electrode 3 and the first vertical transfer electrode 4 (see FIG. 1) is formed so as to cover the partial insulation film 25.

In Embodiment 2, this partial insulation film 25 and a part of the insulation film 26 where the partial insulation film 25 is overlapped serve as the thick part 8. Incidentally, a thickness and a width of the partial insulation film 25 may be set similarly to those of the second part in Embodiment 1. Moreover, the partial insulation film 25 is a laminate film of the insulation films 25a and 25b, which will be described below.

As shown in FIG. 6, in Embodiment 2, unlike Embodiment 1, a step difference adjusting film 38 and an intermediate layer 37 are formed in this order on an underlying insulation layer 36 that covers the shade film 5, and the lens formation layer 31 for forming the lens element 33 is formed thereon. In Embodiment 2, the concave curved surface part 32 for shaping the lens element 33 is formed in the intermediate layer 37.

The manufacturing steps of the solid-state imaging device according to Embodiment 2 will be described with reference to FIGS. 7 and 8. FIGS. 7 and 8 are cross-sectional views showing a method for manufacturing the solid-state imaging device according to Embodiment 2 of the present invention. FIGS. 7A to 7D respectively show a sequence of main manufacturing steps. FIGS. 8A to 8C respectively show a sequence of main manufacturing steps that are performed after the step shown in FIG. 7D.

Figure 7A:
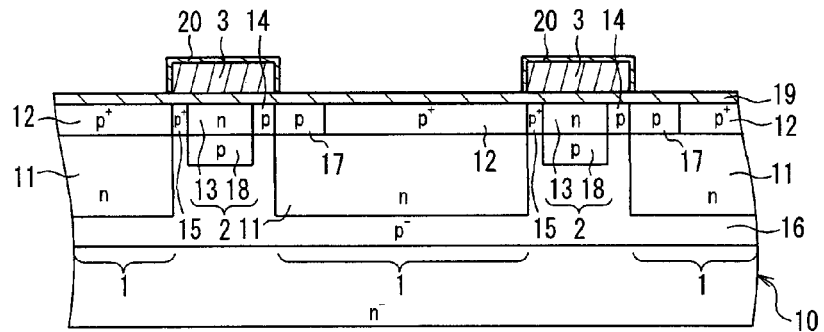
FIGS. 7A to 7D respectively show a sequence of main manufacturing steps.

Initially, as shown in FIG. 7A, a step that is similar to the step shown in FIG. 4A in Embodiment 1 is carried out. Thereby, the respective semiconductor regions, the second vertical transfer electrode 3 and the first vertical transfer electrode 4 (not illustrated in FIG. 7) are formed. Moreover, on the upper surface and the lateral surfaces of the second vertical transfer electrode 3, the insulation film (silicon oxide film) 20 is formed by thermal oxidation. Also on the upper surface and the lateral surfaces of the first vertical transfer electrode 4, the insulation film (not illustrated in FIG. 7) is formed.

Figure 7B:
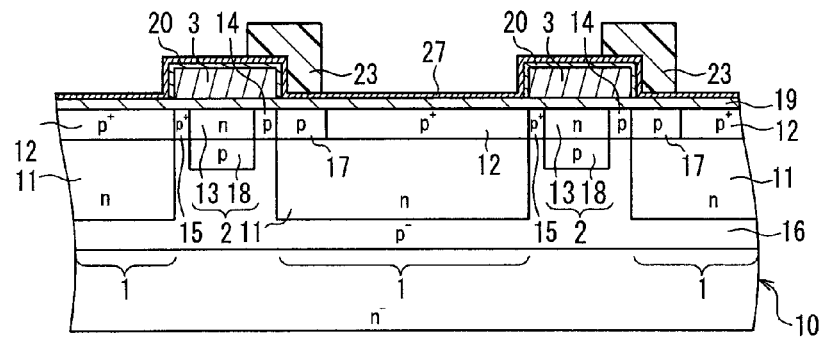
Figure 8A:
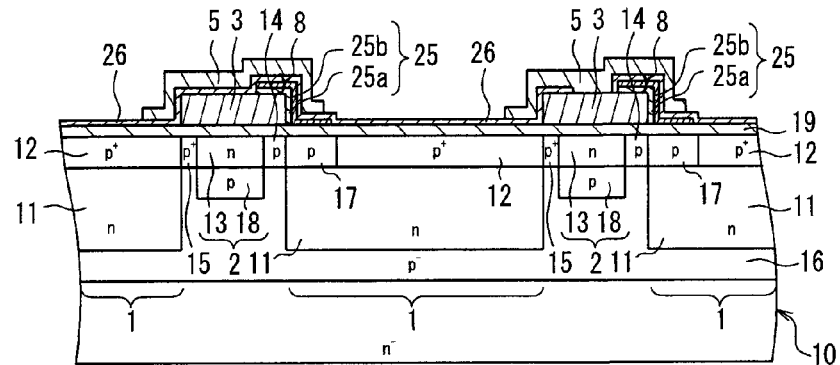
FIGS. 8A to 8C respectively show a sequence of main manufacturing steps that are performed after the step shown in FIG. 7D.
Figure 8B:
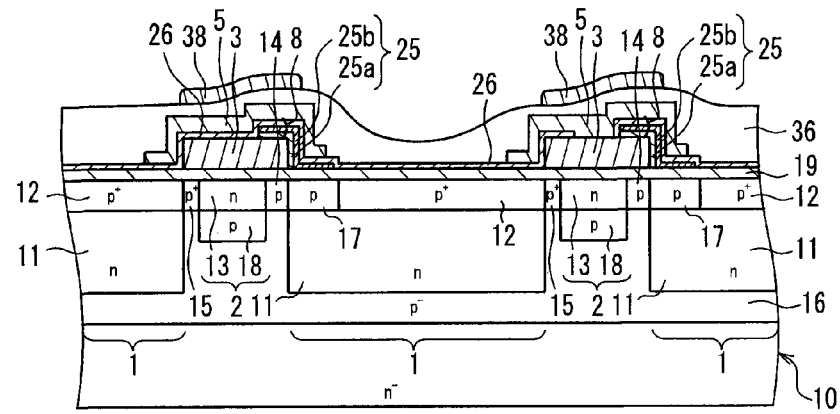
Figure 8C:
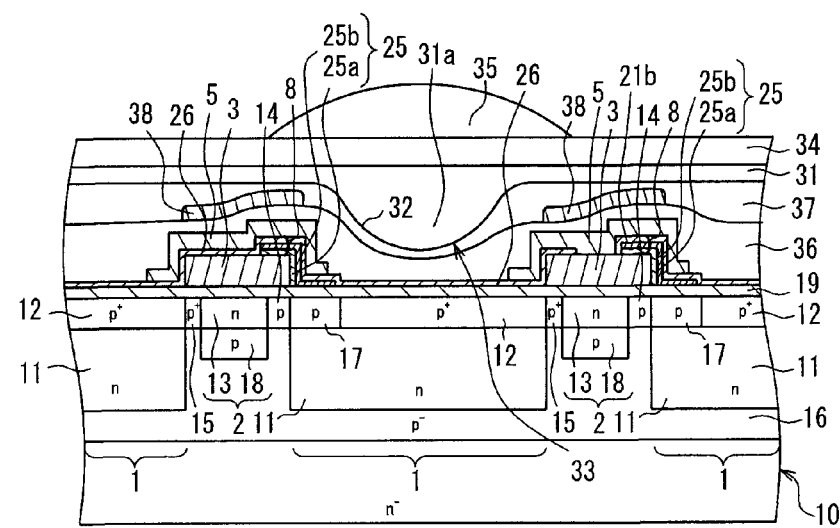

Next, as shown in FIG. 7B, an insulation film 27 that covers the entire upper surface of the semiconductor substrate 10 including the second vertical transfer electrode 3 and the first vertical transfer electrode 4 is formed. More specifically, a silicon oxide film is formed by utilizing low pressure CVD (chemical vapor deposition). At this time, a thickness of the insulation film 27 is smaller than the thickness of the insulation film 22 shown in FIG. 4B, and is set within a range from 10 nm to 100 nm, for example. Thereafter, the resist pattern 23 that is shown also in FIG. 4B is formed. The resist pattern 23 covers the region for forming the thick part 8.

Figure 7C:
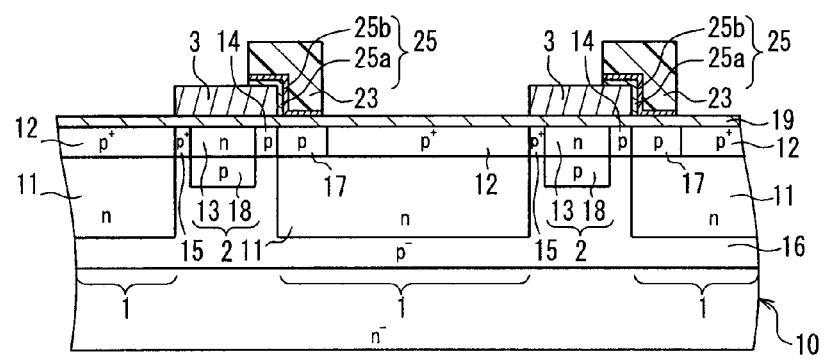

Next, as shown in FIG. 7C, the insulation films 20 and 27 are etched until a part of the insulation films 20 and 27 where the resist pattern 23 does not cover is removed completely. As a result, other part of the insulation film 20 and other part of the insulation film 27 remain, and respectively become the insulation films 25a and 25b shown in FIG. 6, so that the partial insulation film 25 is formed.

Figure 7D:
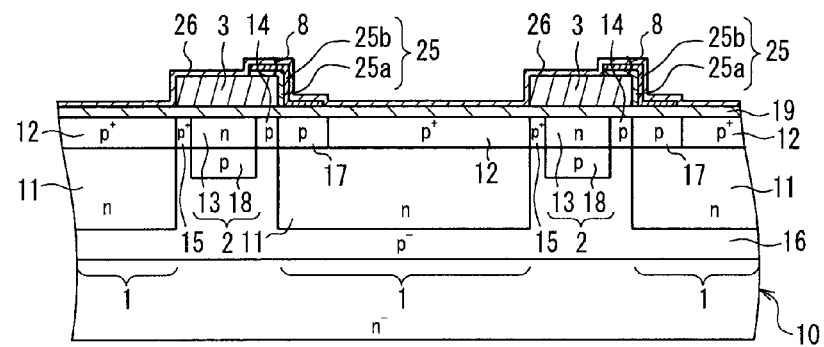

Next, as shown in FIG. 7D, the low pressure CVD is carried out again, so that the insulation film 26 that covers the entire upper surface of the semiconductor substrate 10 including the second vertical transfer electrode 3 and the first vertical transfer electrode 4 is formed. A thickness of the insulation film 26 is set within a range from 10 nm to 100 nm, for example.

In Embodiment 2, the thick part 8 is formed by the steps shown in FIGS. 7B to 7D. Thus, the film thickness of the thick part 8 is determined by the film thicknesses of the insulation films 27 and 26 when forming them. According to Embodiment 2, the variations of the film thickness of the thick part 8 can be suppressed more, and the image quality of the shot image can be improved more stably, compared with Embodiment 1.

Thereafter, the shade film 5 is formed as shown in FIG. 8A. The step shown in FIG. 8A is similar to the step shown in FIG. 4D in Embodiment 1. Next, as shown in FIG. 8B, the underlying insulation layer 36 is formed, and the step difference adjusting film 38 is formed of a metal material thereon.

More specifically, the underlying insulation layer 36 is formed similarly to the formation of the underlying insulation layer 30 shown in FIG. 5A, by forming a BPSG film by CVD and subsequently reflowing by heat treatment. Thereby, a concave part that has a smooth curved surface is formed in a region of the underlying insulation layer 36 where the photoreceptive region 9 (see FIG. 1) is overlapped. In order to provide the smooth curved surface to this concave part, the generation of the residue of etching is suppressed when forming the step difference adjusting film 38 by etching as described below.

This step difference adjusting film 38 is formed by, for example, forming a thin film, forming a resist pattern, etching by using the resist pattern as a mask and removing the resist pattern, in this order. In Embodiment 2, a material for forming the step difference adjusting film 38 is not limited particularly. It should be noted that, from the standpoint of suppressing the generation of smear by the further improvement of the light shading property, the step difference adjusting film 38 is preferably made of a metal material having an excellent light shading property, for example, tungsten or the like.

Next, as shown in FIG. 8C, a BPSG film is formed by the CVD and is subjected to the reflowing by the heat treatment again until the step difference adjusting film 38 is covered, thereby forming the intermediate layer 37. Thereafter, a step that is similar to the step shown in FIG. 5B in Embodiment 1 is carried out, and the lens formation layer 31, the color filter 34 and the microlens 35 are formed in this order so as to obtain the solid-state imaging device of Embodiment 2.

As described above, in Embodiment 2, the concave curved surface part 32 for shaping the lens element 33 is formed in the intermediate layer 37, and the shape of the lens element 33 is determined by the shape of the concave curved surface part 32 in the intermediate layer 37. Further, a curvature of the concave curved surface part 32 can be adjusted not only by a condition for forming the BPSG film, but also by the thickness and the size of the step difference adjusting film 38. Thus, according to Embodiment 2, by setting not only the condition for forming the BPSG film but also the thickness and the size of the step difference adjusting film 38 as appropriate, the curvature of the lens element 33 can be set more freely. Thus, the curvature of the lens element 33 can be optimized easily, so that the sensitivity can be improved further. Moreover, since variations of the curvature of the lens element 33 can be suppressed, the image quality of the shot image also can be improved.

Embodiment 3

Figure 9:
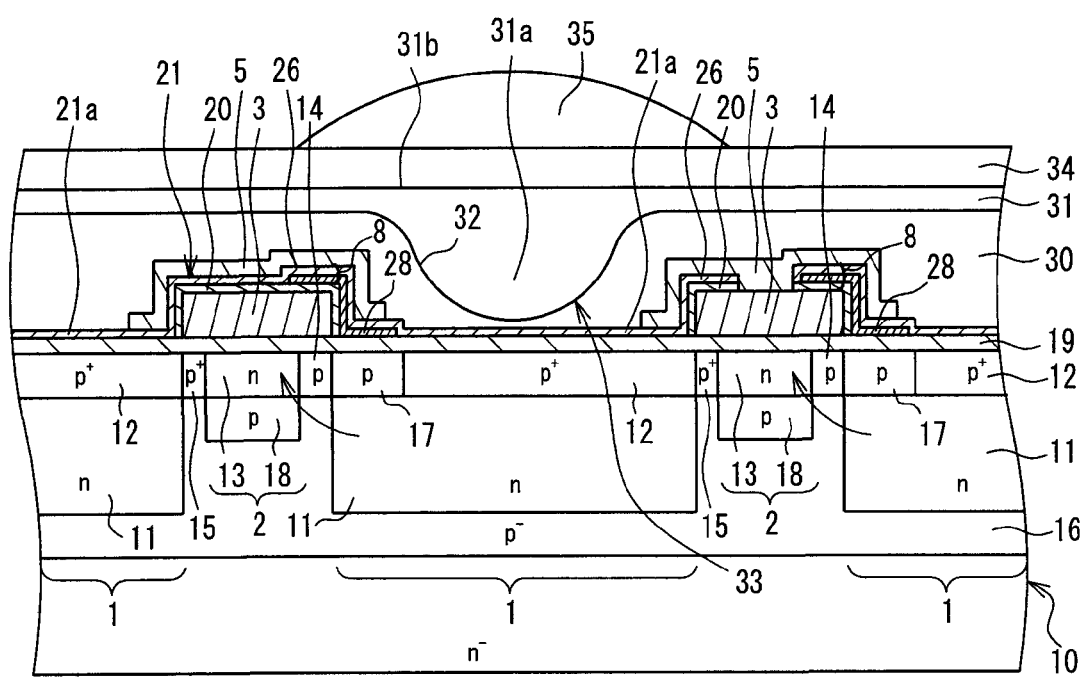
FIG. 9 is a cross-sectional view showing a configuration of a pixel and its periphery of a solid-state imaging device according to Embodiment 3 of the present invention.

Next, a solid-state imaging device according to Embodiment 3 of the present invention and its manufacturing steps will be described below with reference to FIGS. 9 to 11. Initially, a specific configuration of the solid-state imaging device of Embodiment 3 will be described with reference to FIG. 9. FIG. 9 is a cross-sectional view showing a configuration of a pixel and its periphery of the solid-state imaging device according to Embodiment 3 of the present invention. In FIG. 9, the hatching of the inside of the semiconductor substrate 10 and the upper layer of the shade film 5 is omitted.

A difference between the solid-state imaging device of Embodiment 3 and the solid-state imaging device of Embodiment 1 lies in the configuration of the thick part 8. Except for this point, the solid-state imaging device of Embodiment 3 is configured similarly to the solid-state imaging device of Embodiment 1. The difference between Embodiments 1 and 3 will be described below.

As shown in FIG. 9, in Embodiment 3, a partial insulation film 28 is formed in a region where the shade film 5 is overlapped on a side of the photodiode part 1 that is a subject to be read out by the vertical charge transfer part 2 shaded by this shade film 5. Moreover, the partial insulation film 28 is made of a silicon nitride film. Further, the insulation film 26 that insulates the shade film 5 from the second vertical transfer electrode 3 and the first vertical transfer electrode 4 (see FIG. 1) is formed so as to cover the partial insulation film 28, similarly to Embodiment 2.

In Embodiment 3, this partial insulation film 28 and a part of the insulation film 26 where the partial insulation film 28 is overlapped serve as the thick part 8. Incidentally, a thickness and a width of the partial insulation film 28 may be set similarly to those of the second part of Embodiment 1. Also in Embodiment 3, the insulation film (silicon oxide film) 20 is formed on the upper surface and the lateral surfaces of the second vertical transfer electrode 3 by thermal oxidation, similarly to Embodiment 1. Moreover, in Embodiment 3, unlike Embodiment 2, the partial insulation film 28 is formed of a single-layer insulation film. This point will be described below.

The manufacturing steps of the solid-state imaging device according to Embodiment 3 will be described with reference to FIGS. 10 and 11. FIGS. 10 and 11 are cross-sectional views showing a method for manufacturing the solid-state imaging device according to Embodiment 3 of the present invention. FIGS. 10A to 10D respectively show a sequence of main manufacturing steps. FIGS. 11A to 11C respectively show a sequence of main manufacturing steps that are performed after the step shown in FIG. 10D.

Figure 10A:
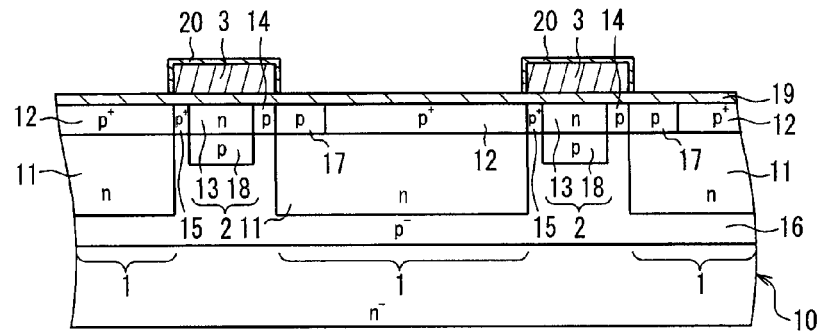
FIGS. 10A to 10D respectively show a sequence of main manufacturing steps.

Initially, as shown in FIG. 10A, a step that is similar to the step shown in FIG. 4A in Embodiment 1 is carried out. Thereby, the respective semiconductor regions, the second vertical transfer electrode 3 and the first vertical transfer electrode 4 (not illustrated in FIG. 10) are formed. Moreover, on the upper surface and the lateral surfaces of the second vertical transfer electrode 3, the insulation film 20 is formed by thermal oxidation. Also on the upper surface and the lateral surfaces of the first vertical transfer electrode 4, the insulation film (not illustrated in FIG. 10) is formed.

Figure 10B:
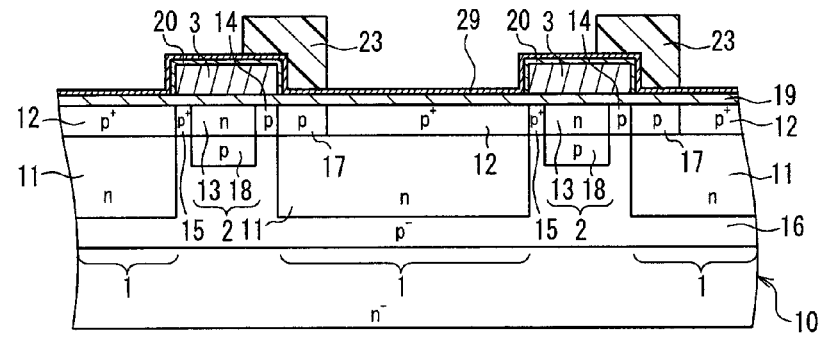
Figure 11A:
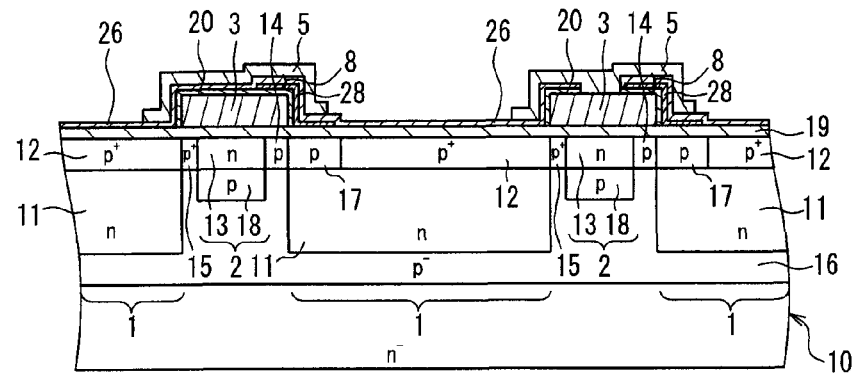
FIGS. 11A to 11C respectively show a sequence of main manufacturing steps that are performed after the step shown in FIG. 10D.
Figure 11B:
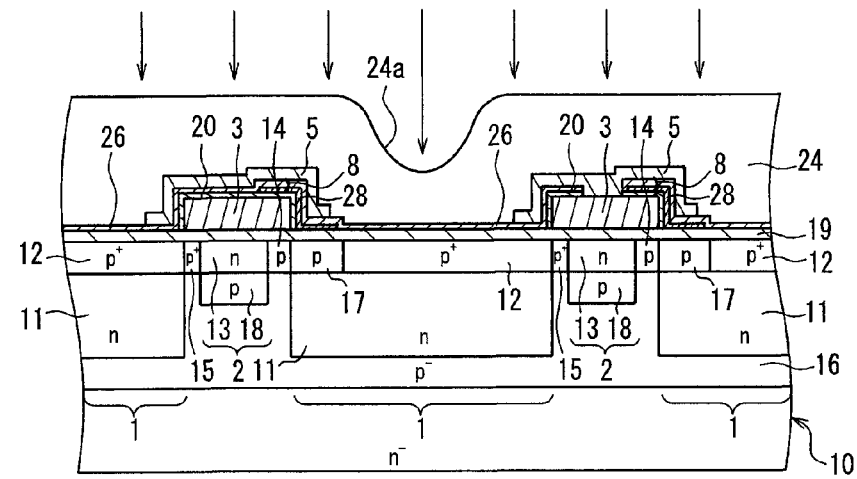
Figure 11C:
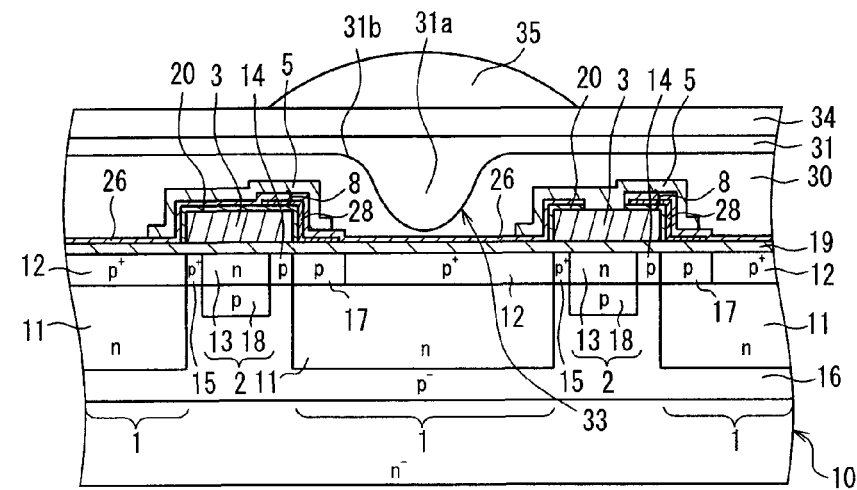

Next, as shown in FIG. 10B, a silicon nitride film 29 that covers the entire upper surface of the semiconductor substrate 10 including the second vertical transfer electrode 3 and the first vertical transfer electrode 4 is formed by utilizing low pressure CVD (chemical vapor deposition) or the like. At this time, a thickness of the silicon nitride film 29 is set within a range from 10 nm to 100 nm, for example. Thereafter, the resist pattern 23 that is shown also in FIG. 4B is formed. The resist pattern 23 covers the region for forming the thick part 8.

Figure 10C:
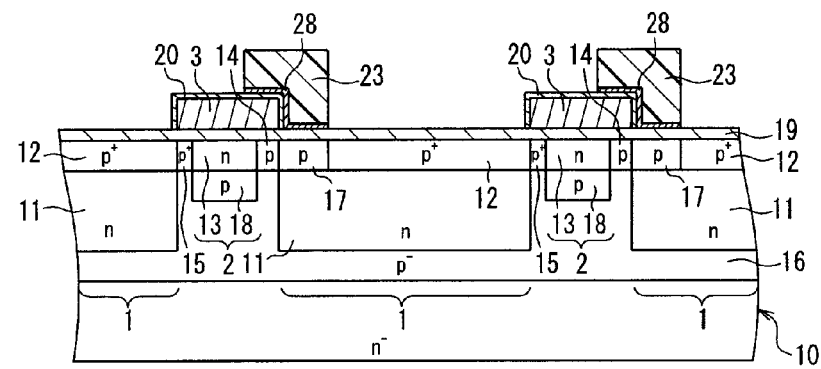

Next, as shown in FIG. 10C, the silicon nitride film 29 is etched until a part of the silicon nitride film 29 where the resist pattern 23 does not cover is removed completely. More specifically, for example, wet etching using phosphoric acid is carried out. Since this etching has a high selectivity with respect to a silicon oxide film, and the gate insulation film 19 and the insulation film 20 are made of silicon oxide films, only the part of the silicon nitride film 29 where the resist pattern 23 does not cover is removed completely. At this time, a loss of the film thickness of the insulation film 20 caused by the etching is suppressed.

Figure 10D:
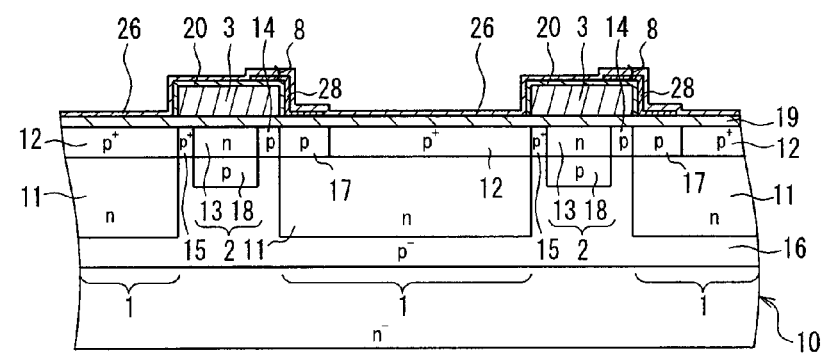

Next, as shown in FIG. 10D, after the removal of the resist pattern 23, low pressure CVD is carried out so as to form the insulation film 26 that covers the entire upper surface of the semiconductor substrate 10 including the second vertical transfer electrode 3 and the first vertical transfer electrode 4 (not illustrated in FIG. 10). The insulation film 26 is a silicon oxide film. Moreover, the thickness of the insulation film 26 is set within a range from 10 nm to 100 nm, for example.

In Embodiment 3, the thick part 8 is formed by the steps shown in FIGS. 10B to 10D. The film thicknesses of the insulation film 20, the silicon nitride film 29 and the insulation film 26 are not lost by these steps. Thus, similarly to Embodiment 2, the film thickness of the thick part 8 is determined by these film thicknesses when forming the silicon nitride film 29 and the insulation film 26. Also in Embodiment 3, the variations of the film thickness of the thick part 8 are suppressed more than those in Embodiment 1, and the image quality of the shot image can be improved stably.

Next, as shown in FIG. 11A, the shade film 5 is formed. The step shown in FIG. 11A is similar to the step shown in FIG. 4D in Embodiment 1. Next, as shown in FIG. 11B, the insulation film 24 that will become the underlying insulation layer 30 is formed by the formation of the BPSG film and the reflowing by the heat treatment, and is etched, thereby completing the underlying insulation layer 30 (see FIG. 11C). Thereafter, as shown in FIG. 11C, the lens formation layer 31, the color filter 34 and the microlens 35 are formed in this order so as to obtain the solid-state imaging device of Embodiment 3.

Incidentally, the step shown in FIG. 11B is similar to the step shown in FIG. 5A in Embodiment 1. Moreover, the step shown in FIG. 11C is similar to the step shown in FIG. 5B in Embodiment 1.

Figure 29:
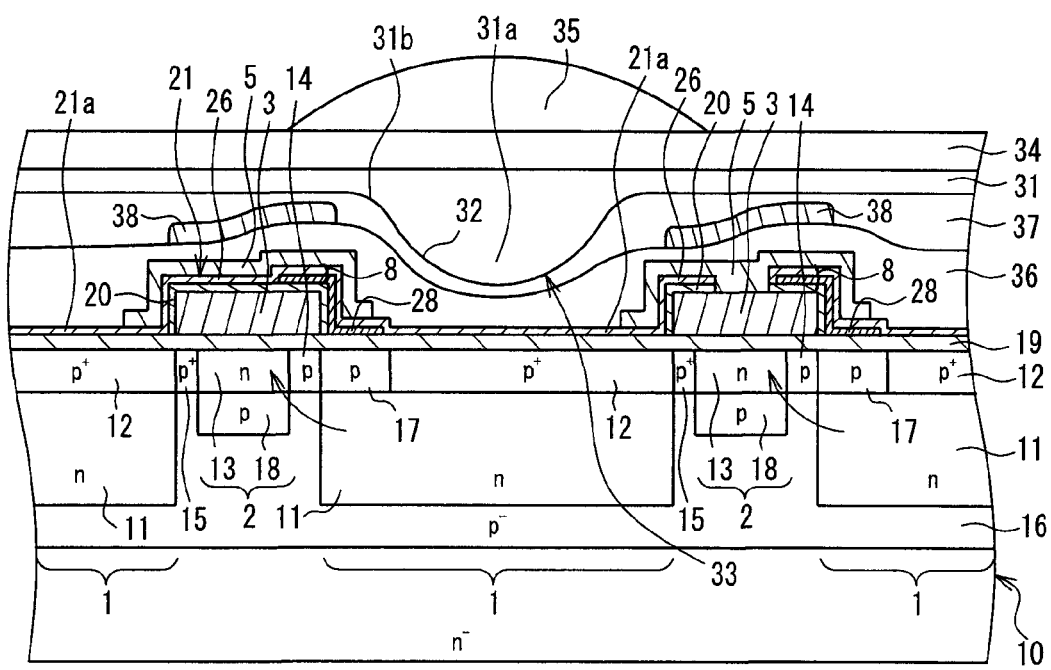
FIG. 29 is a cross-sectional view showing a configuration of a pixel and its periphery of a solid-state imaging device according to another example of Embodiment 3 of the present invention.

Moreover, in Embodiment 3, the configuration of the lens element 33 can be similar to that in Embodiment 2. FIG. 29 is a cross-sectional view showing a configuration of a pixel and its periphery of a solid-state imaging device according to another example of Embodiment 3 of the present invention.

As shown in FIG. 29, also in Embodiment 3, the step difference adjusting film 38 and the intermediate layer 37 can be formed on the underlying insulation layer 36 that covers the shade film 5, similarly to Embodiment 2. The concave curved surface part 32 is formed in the intermediate layer 37. Then, the lens formation layer 31 is formed on the intermediate layer 37, thereby obtaining the lens element 33.

Also in Embodiment 3, if adopting the case shown in FIG. 29, the curvature of the lens element 33 can be set more freely, by setting not only the condition for forming the BPSG film but also the thickness and the size of the step difference adjusting film 38 as appropriate. Thus, the curvature of the lens element 33 can be optimized easily, so that the sensitivity can be improved further.

Embodiment 4

Figure 12:
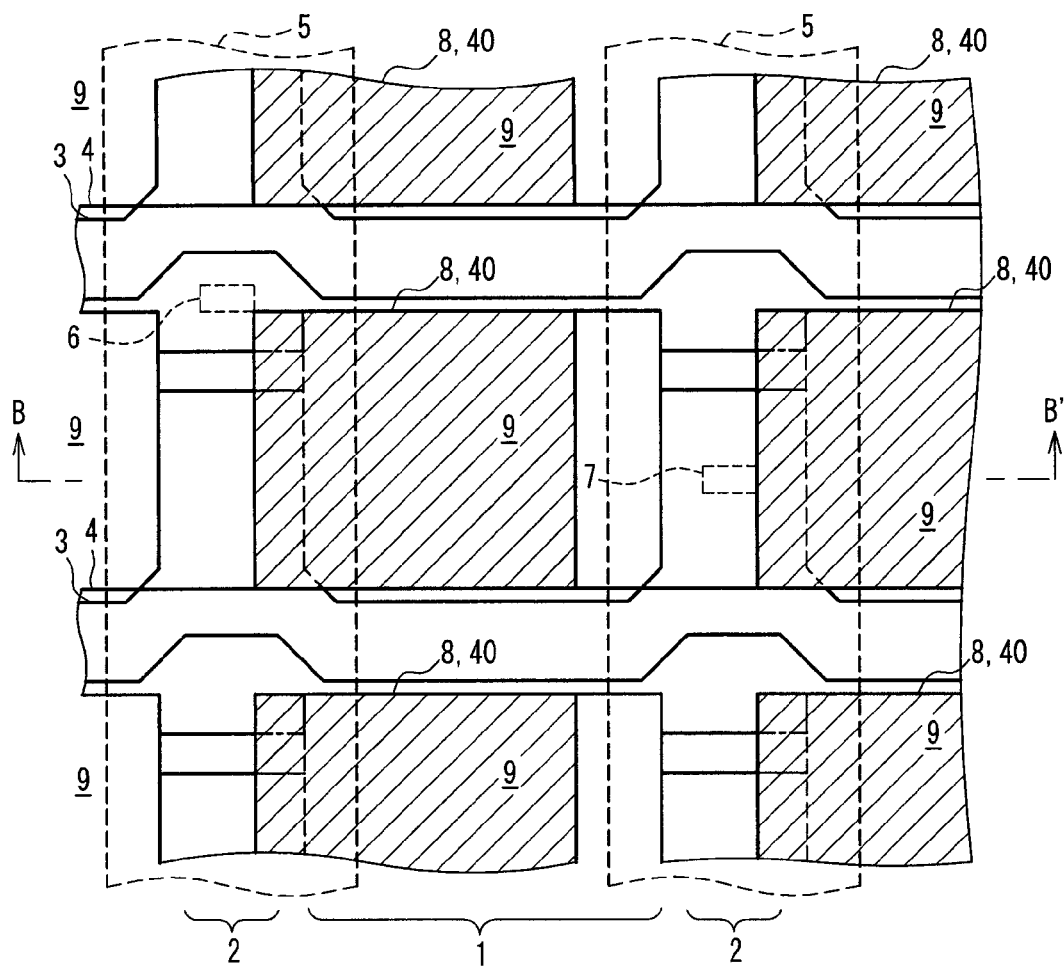
FIG. 12 is a plan view showing a configuration of a pixel and its periphery of a solid-state imaging device according to a first example of Embodiment 4 of the present invention.
Figure 13:
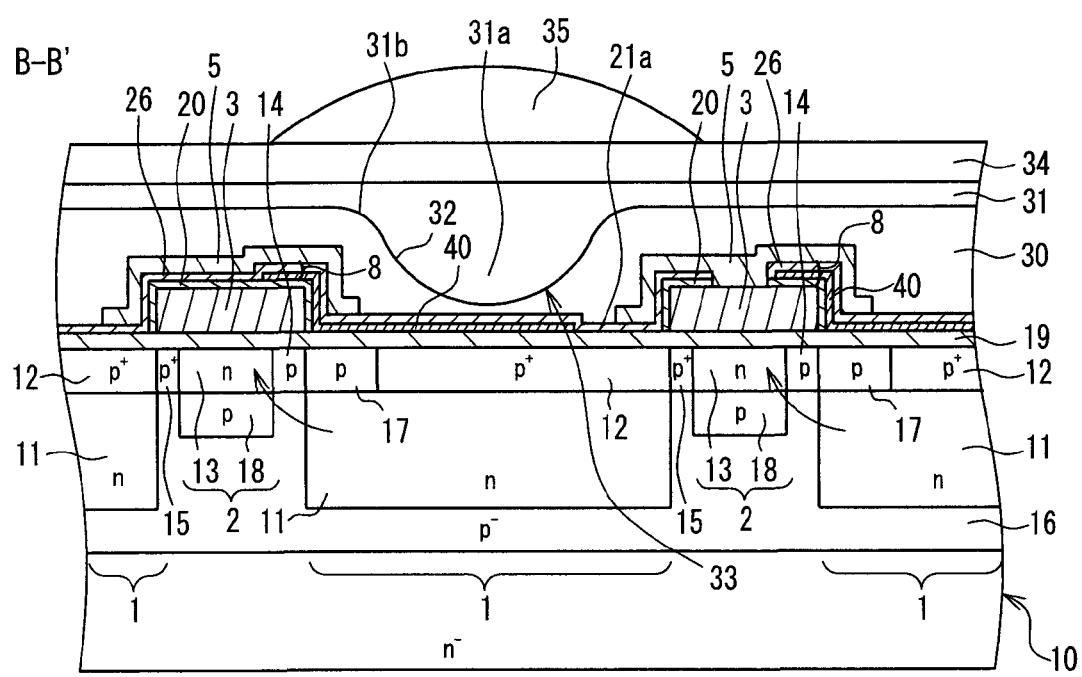
FIG. 13 is a cross-sectional view taken on line B-B' of FIG. 12.

Next, a solid-state imaging device according to Embodiment 4 of the present invention and its manufacturing steps will be described below with reference to FIGS. 12 to 18. Initially, a specific configuration of the solid-state imaging device of Embodiment 4 will be described with reference to FIGS. 12 and 13. FIG. 12 is a plan view showing a configuration of a pixel and its periphery of a solid-state imaging device according to a first example of Embodiment 4 of the present invention. FIG. 13 is a cross-sectional view taken on line B-B' of FIG. 12.

In FIG. 12, the shade film 5 is shown in broken line, and regions for forming the thick part 8 and the partial insulation film 40 are hatched. Moreover, in FIG. 12, description of insulating members except for the partial insulation film 40 is omitted. Further, in FIG. 13, the hatching of the inside of the semiconductor substrate 10 and the upper layer of the shade film 5 is omitted.

As shown in FIGS. 12 and 13, also in Embodiment 4, a partial insulation film 40 is formed in a region where the shade film 5 is overlapped on a side of the photodiode part 1 that is a subject to be read out by the vertical charge transfer part 2 shaded by this shade film 5, similarly to Embodiment 3. Moreover, the partial insulation film 40 also is made of a silicon nitride film, similarly to the partial insulation film 28 shown in FIG. 9 in Embodiment 3.

It should be noted that, in Embodiment 4, the partial insulation film 40 is formed so as to cover the photoreceptive region 9 of the photodiode part 1. In this point, the solid-state imaging device of Embodiment 4 is different from the solid-state imaging device of Embodiment 3. Except for this point, the solid-state imaging device of Embodiment 4 is configured similarly to the solid-state imaging device of Embodiment 3. Moreover, the photodiode part 1 of which the photoreceptive region 9 is covered with the partial insulation film 40 is the photodiode part 1 that is a subject to be read out by the vertical charge transfer part 2 provided with the partial insulation film 40.

As described above, in Embodiment 4, the partial insulation film 40 spreads to the photoreceptive region 9 of each of the photodiode parts 1, and light that has passed through the partial insulation film 40 is incident into the photodiode parts 1. At this time, due to an optical property of the silicon nitride film that constitutes the partial insulation film 40, the partial insulation film 40 functions as an antireflection film that suppresses reflection of light at an interface. Thus, the sensitivity of the solid-state imaging device of Embodiment 4 can be improved more than the sensitivities of the solid-state imaging devices of Embodiments 1 to 3. Incidentally, a thickness of the partial insulation film 40 may be set such that the reflection of light at the interface can be decreased. For example, the thickness of the partial insulation film 40 is set within a range from 10 nm to 100 nm, for example.

The manufacturing steps of the solid-state imaging device according to Embodiment 4 will be described with reference to FIGS. 14 and 15. FIGS. 14 and 15 are cross-sectional views showing a method for manufacturing the solid-state imaging device according to a first example of Embodiment 4 of the present invention. FIGS. 14A to 14D respectively show a sequence of main manufacturing steps. FIGS. 15A to 15C respectively show a sequence of main manufacturing steps that are performed after the step shown in FIG. 14D.

Figure 14A:
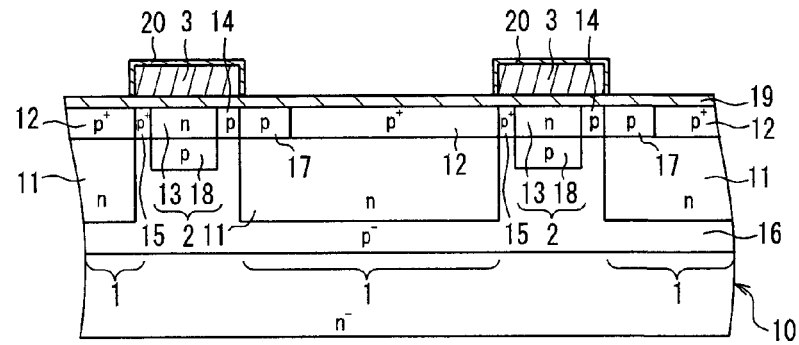
FIGS. 14A to 14D respectively show a sequence of main manufacturing steps.

Initially, as shown in FIG. 14A, a step that is similar to the step shown in FIG. 4A in Embodiment 1 is carried out. Thereby, the respective semiconductor regions, the second vertical transfer electrode 3 and the first vertical transfer electrode 4 (not illustrated in FIG. 14) are formed. Moreover, on the upper surface and the lateral surfaces of the second vertical transfer electrode 3, the insulation film (silicon oxide film) 20 is formed by thermal oxidation. Also on the upper surface and the lateral surfaces of the first vertical transfer electrode 4, the insulation film (not illustrated in FIG. 14) is formed.

Figure 14B:
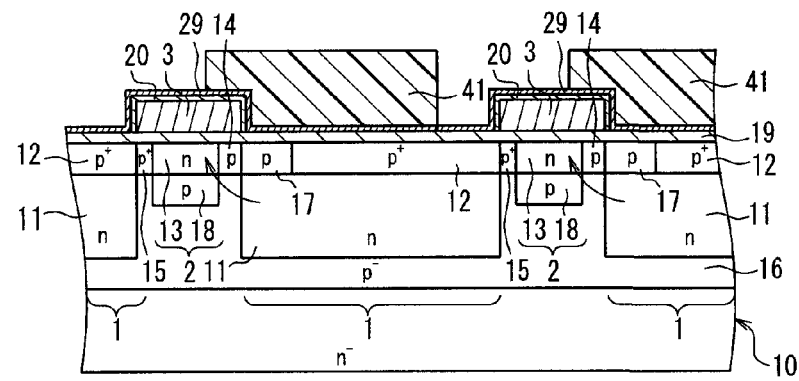
Figure 15A:
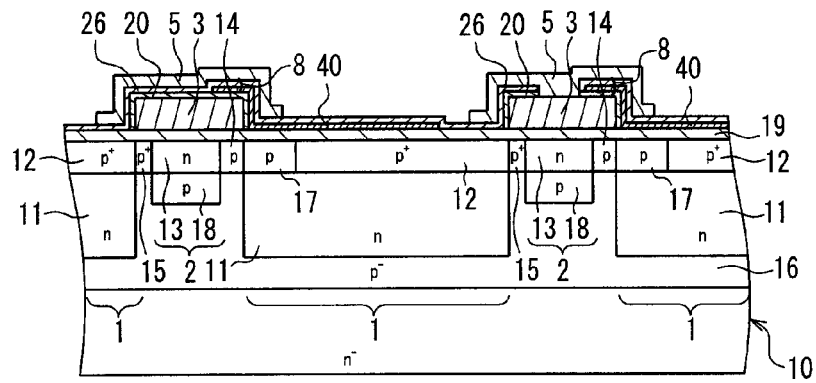
FIGS. 15A to 15C respectively show a sequence of main manufacturing steps that are performed after the step shown in FIG. 14D.
Figure 15B:
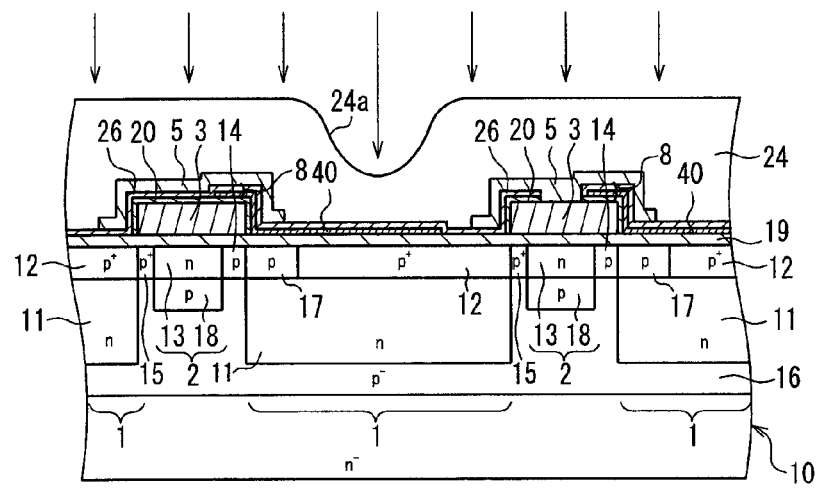
Figure 15C:
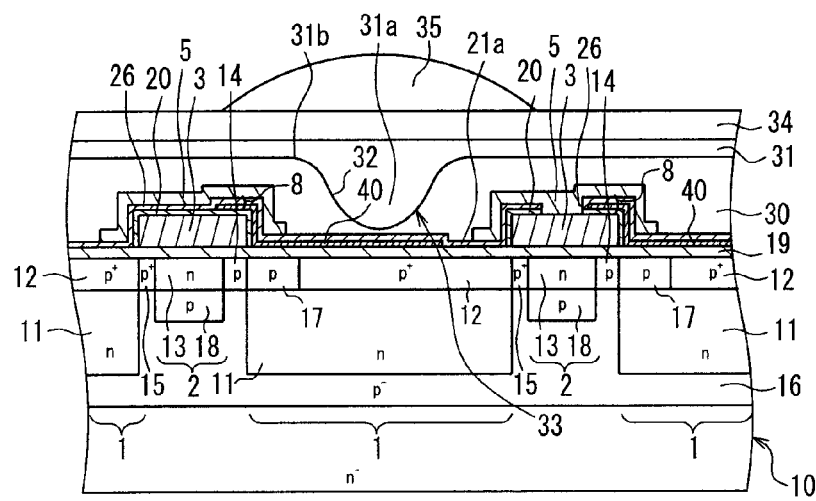

Next, as shown in FIG. 14B, a step that is similar to the step shown in FIG. 10B in Embodiment 3 is carried out. Thereby, the silicon nitride film 29 that covers the entire upper surface of the semiconductor substrate 10 including the second vertical transfer electrode 3 and the first vertical transfer electrode 4 is formed.

Thereafter, a resist pattern 41 is formed as shown in FIG. 14B, but a pattern shape of the resist pattern 41 is different from the pattern shape of the resist pattern 23 shown in FIG. 10B. The resist pattern 41 is formed so as to cover a part of the region for forming the shade film 5 and the photoreceptive region 9 (see FIG. 13).

Figure 14C:
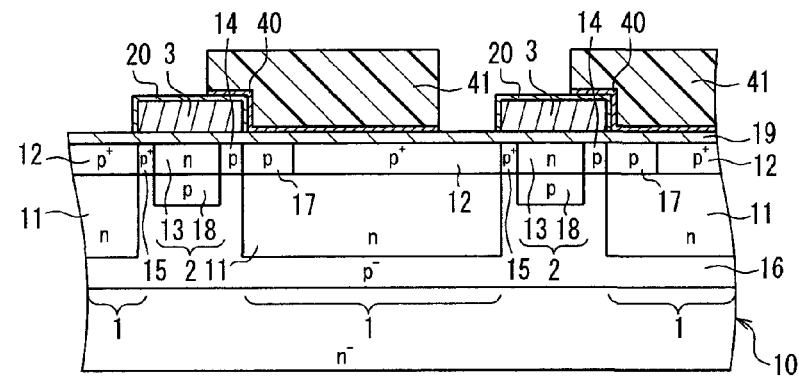

Next, as shown in FIG. 14C, the silicon nitride film 29 is etched until a part of the silicon nitride film 29 where the resist pattern 41 does not cover is removed completely. The etching in this case also is the wet etching using phosphoric acid, similarly to the step shown in FIG. 10C in Embodiment 3. Also in this step, the loss of the film thickness of the insulation film 20 caused by the etching is suppressed.

Figure 14D:
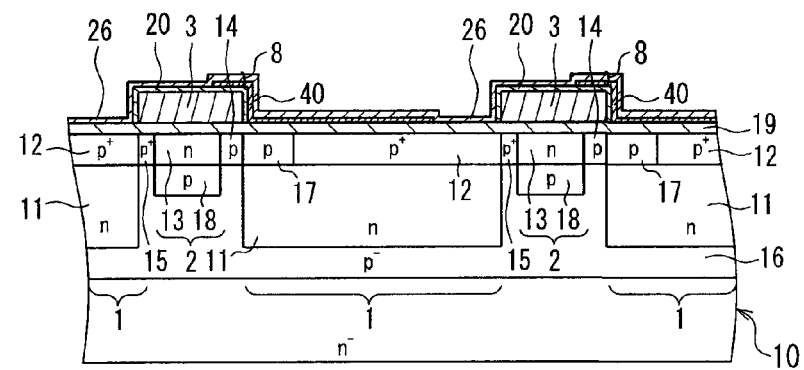

Next, as shown in FIG. 14D, the resist pattern 41 is removed, and subsequently, the insulation film 26 that covers the entire upper surface of the semiconductor substrate 10 including the second vertical transfer electrode 3 and the first vertical transfer electrode 4 is formed. This step is similar to the step shown in FIG. 10D in Embodiment 3, and the insulation film 26 is a silicon oxide film.

In Embodiment 4, the thick part 8 is formed by the steps shown in FIGS. 14B to 14D. Also in Embodiment 4, the variations of the film thickness of the thick part 8 are suppressed similarly to Embodiment 3, and the image quality of the shot image can be improved stably.

Next, as shown in FIG. 15A, the shade film 5 is formed. The step shown in FIG. 15A is similar to the step shown in FIG. 4D in Embodiment 1. Next, as shown in FIG. 15B, the insulation film 24 that will become the underlying insulation layer 30 is formed by the formation of the BPSG film and the reflowing by the heat treatment, and is etched, thereby completing the underlying insulation layer 30 (see FIG. 15C). Thereafter, as shown in FIG. 15C, the lens formation layer 31, the color filter 34 and the microlens 35 are formed in this order so as to obtain the solid-state imaging device of Embodiment 4.

Incidentally, the step shown in FIG. 15B is similar to the step shown in FIG. 5A in Embodiment 1. Moreover, the step shown in FIG. 15C is similar to the step shown in FIG. 5B in Embodiment 1.

Figure 16:
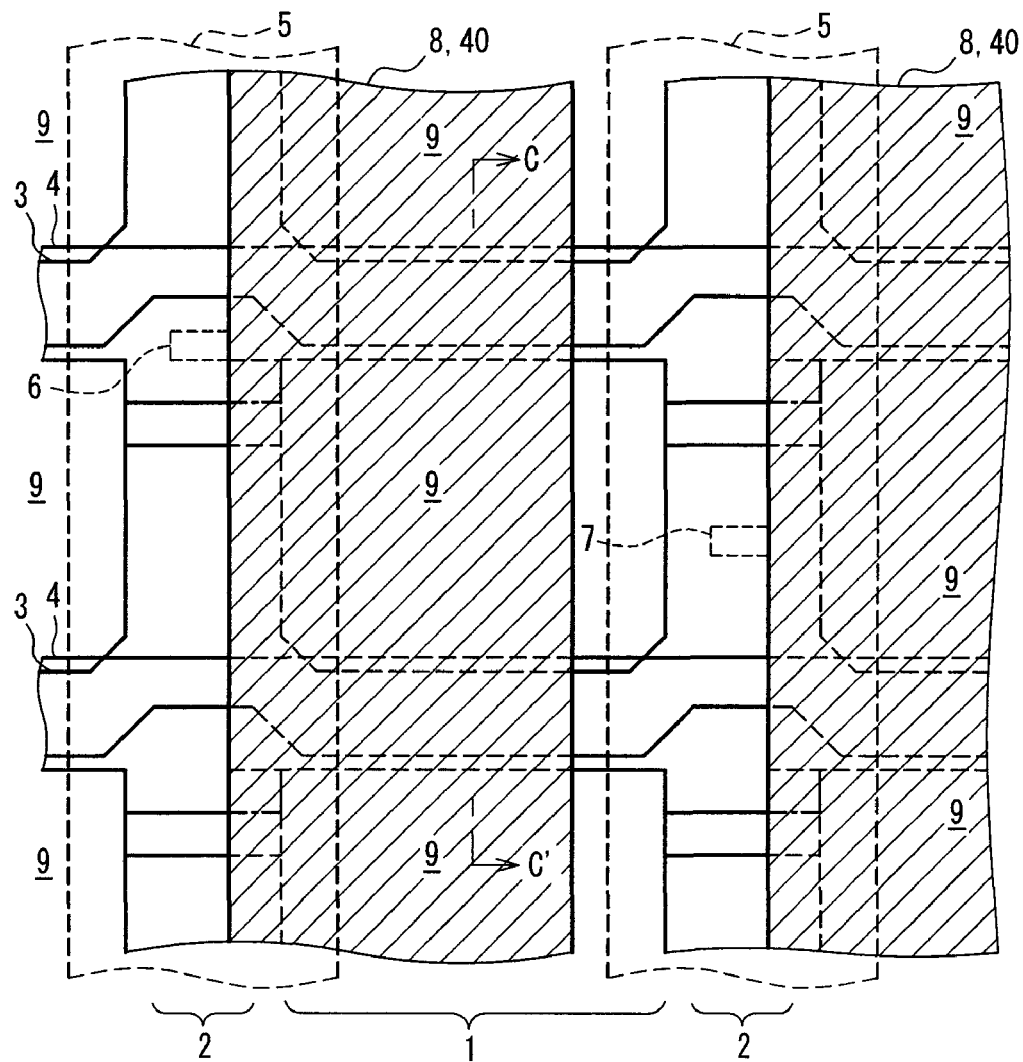
FIG. 16 is a plan view showing a configuration of a pixel and its periphery of a solid-state imaging device according to a second example of Embodiment 4 of the present invention.
Figure 17:
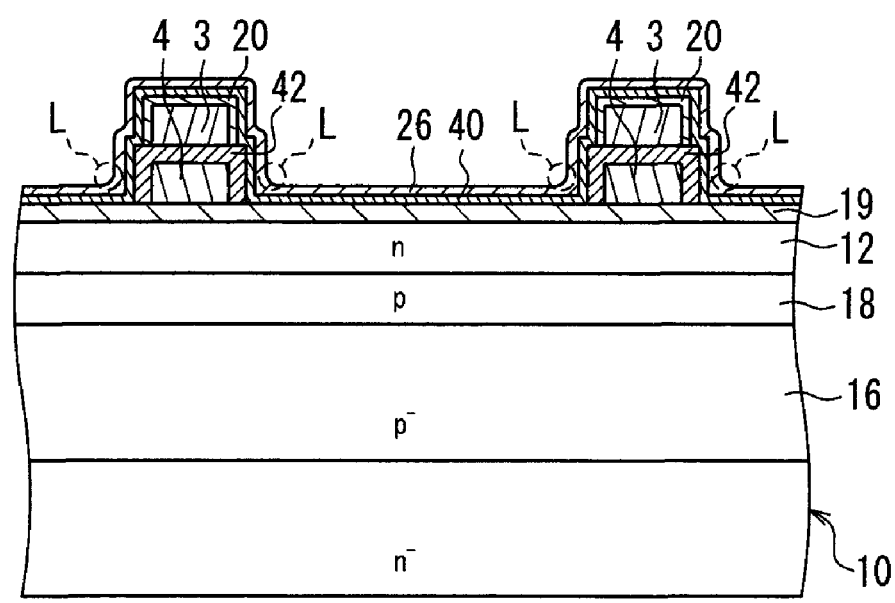
FIG. 17 is a cross-sectional view taken on line C-C' of FIG. 16.
Figure 18:
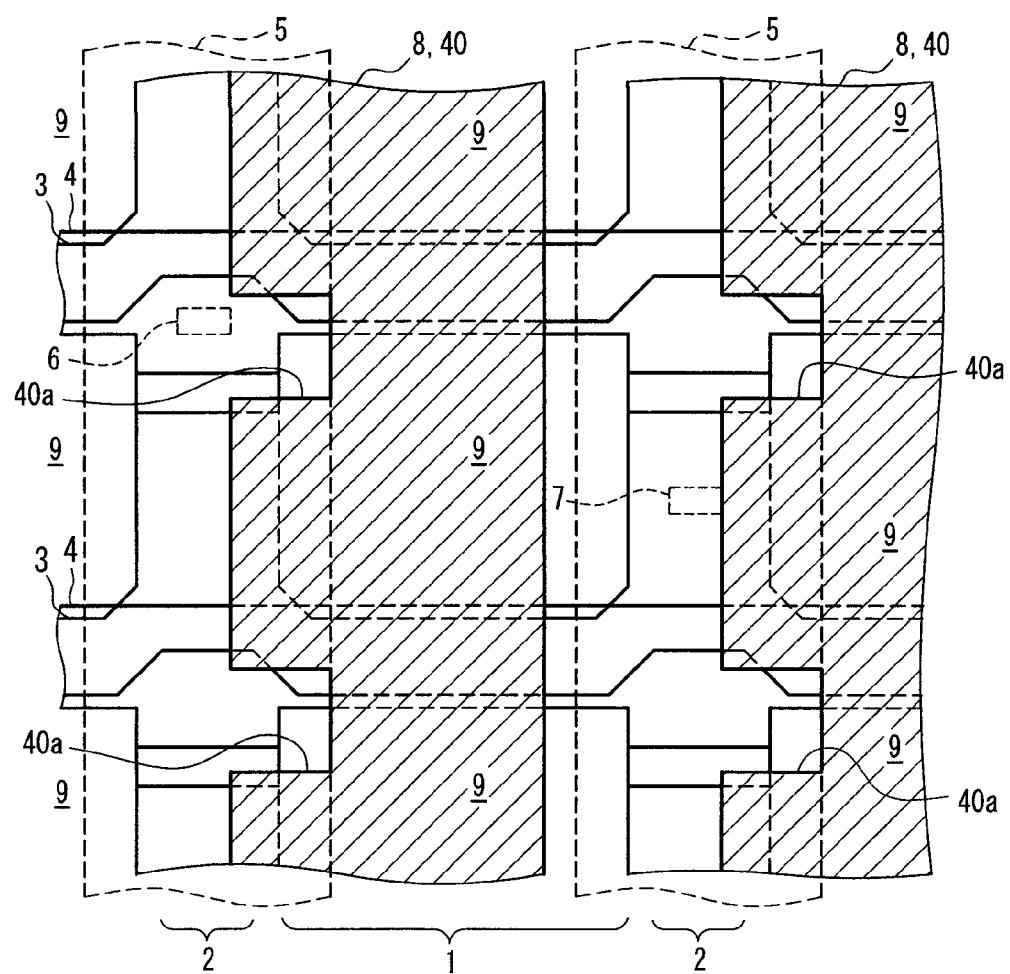
FIG. 18 is a plan view showing a configuration of a pixel and its periphery of a solid-state imaging device according to a third example of Embodiment 4 of the present invention.

Next, the solid-state imaging devices according to second and third examples of Embodiment 4 will be described with reference to FIGS. 16 to 18. FIG. 16 is a plan view showing a configuration of a pixel and its periphery of the solid-state imaging device according to the second example of Embodiment 4 of the present invention. FIG. 17 is a cross-sectional view taken on line C-C' of FIG. 16. FIG. 18 is a plan view showing a configuration of a pixel and its periphery of the solid-state imaging device according to the third example of Embodiment 4 of the present invention.

As shown in FIG. 16, in the second example, the partial insulation film 40 is formed such that the outer shape of the thick part 8 is a strip shape extending in the vertical direction, when the thick part 8 is seen from the upside of the semiconductor substrate 10 (see FIG. 13). The partial insulation film 40 covers the region between the photodiode parts 1 that are adjacent to each other in the vertical direction. More specifically, as shown in FIG. 17, in a region where the second vertical transfer electrode 3 and the first vertical transfer electrode 4 are overlapped with each other in a normal line direction of the semiconductor substrate 10, the partial insulation film 40 covers a laminate of the second vertical transfer electrode 3 and the first vertical transfer electrode 4.

Figure 28:
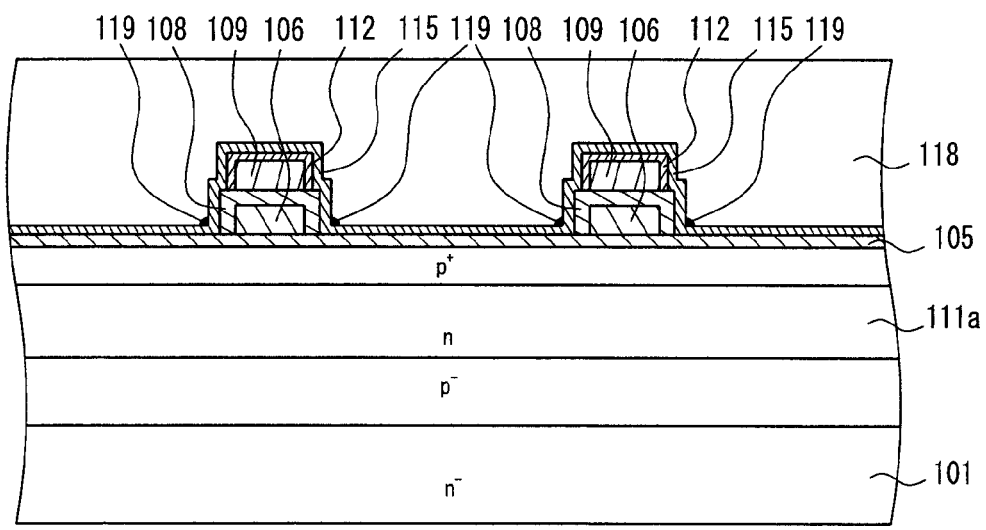
FIG. 28 is a cross-sectional view taken on line Z-Z' of FIG. 25.

Here, the cross-sectional view shown in FIG. 17 and the cross-sectional view shown in FIG. 28 in the background art will be compared. As shown in FIGS. 17 and 28, in a region where the transfer channel is not present, the second vertical transfer electrode and the first vertical transfer electrode are arranged so as to be laminated. In FIG. 17, reference numeral 42 denotes an insulation film (silicon oxide film) that is formed on the surface of the first vertical transfer electrode 4 by thermal oxidation.

As shown in FIG. 28, in the conventional example, only the shade film insulation layer 115 covers the entire laminate of the first vertical transfer electrode 106 and the second vertical transfer electrode 109. Thus, on an intersection of a wall surface and a flat surface that are formed of the outermost shade film insulation layer 115, an angle is likely to be formed, and in some cases, the wall surface may be overhung, so that the angle between the wall surface and the flat surface may become an acute angle.

Thus, in the conventional example, when the conductive film is etched for forming the shade film 5, a part of the conductive film (a residue of etching 119 shown in FIG. 28) may remain on the intersection of the wall surface and the flat surface outside the region for forming the shade film 5. If the residue of etching 119 is generated, a short circuit may occur between the transfer electrodes thereby, and the transfer pulse cannot be supplied normally, so that a transfer failure of the signal charge may occur.

On the other hand, in Embodiment 4, as shown in FIG. 17, the entire laminate of the second vertical transfer electrode 3 and the first vertical transfer electrode 4 is covered with double-layer insulation films constituted of the partial insulation film 40 and the insulation film 26. Thus, on the intersection of the wall surface and the flat surface formed of the outermost insulation film 26 (a part L enclosed by a broken line in FIG. 17), not an angle but a gentle slope is formed. Thereby, according to Embodiment 4, the generation of the residue of etching 119 can be suppressed, so that the degradation of the image quality of the shot image can be suppressed.

Moreover, in the second example shown in FIG. 16, the partial insulation film 40 is formed such that the thick part 8 has a strip shape, but Embodiment 4 is not limited to this. The partial insulation film 40 may be formed such that the outer shape of the thick part 8 is the strip shape with a notch 40a on its periphery, like the partial insulation film 40 of the third example shown in FIG. 18.

In the case of adopting the third example shown in FIG. 18, a window for introducing hydrogen at the time of hydrogen sintering (heat treatment) is secured, regardless of whether a positional displacement of the partial insulation film 40 occurs in the vertical direction or in the horizontal direction due to a positional displacement of the mask in the formation step (see FIG. 14B). According to the third example, since the hydrogen sintering can be carried out reliably, the generation of a dark current can be suppressed stably.

Figure 30:
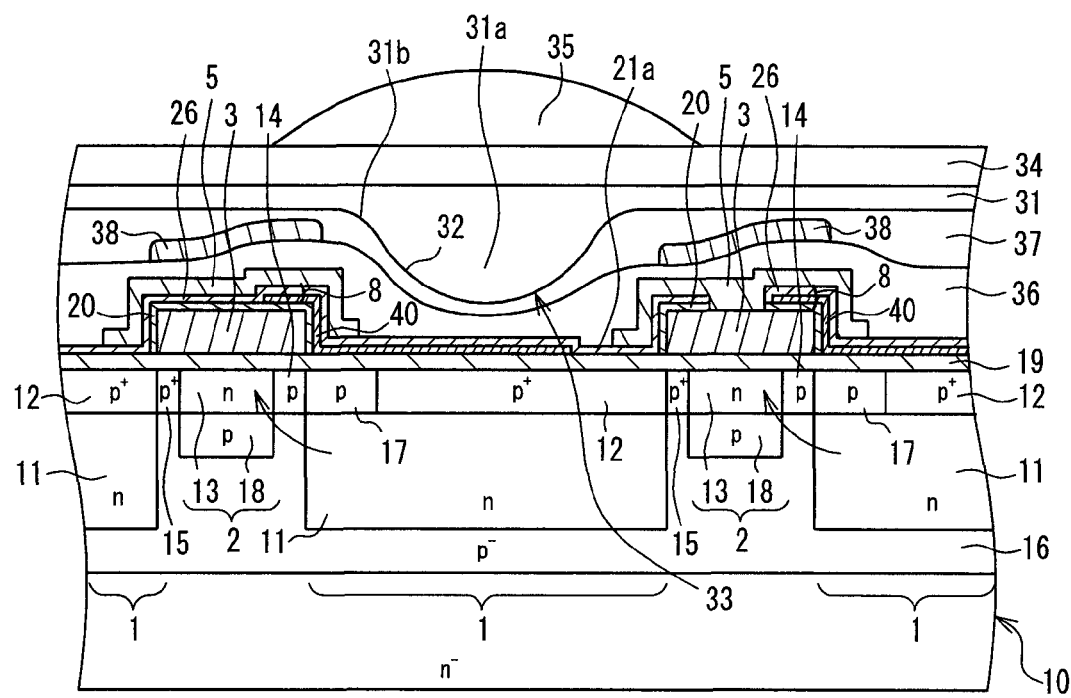
FIG. 30 is a cross-sectional view showing a configuration of a pixel and its periphery of a solid-state imaging device according to a fourth example of Embodiment 4 of the present invention.

Moreover, in Embodiment 4, the configuration of the lens element 33 can be similar to that in Embodiment 2. FIG. 30 is a cross-sectional view showing a configuration of a pixel and its periphery of a solid-state imaging device according to a fourth example of Embodiment 4 of the present invention.

As shown in FIG. 30, also in Embodiment 4, the step difference adjusting film 38 and the intermediate layer 37 can be formed on the underlying insulation layer 36 that covers the shade film 5, similarly to Embodiment 2. The concave curved surface part 32 is formed in the intermediate layer 37. Then, the lens formation layer 31 is formed on the intermediate layer 37, thereby obtaining the lens element 33.

Also in Embodiment 4, if adopting the case of FIG. 30, the curvature of the lens element 33 can be set more freely, by setting not only the condition for forming the BPSG film but also the thickness and the size of the step difference adjusting film 38 as appropriate. Thus, the curvature of the lens element 33 can be optimized easily, so that the sensitivity can be improved further.

Embodiment 5

Figure 19:
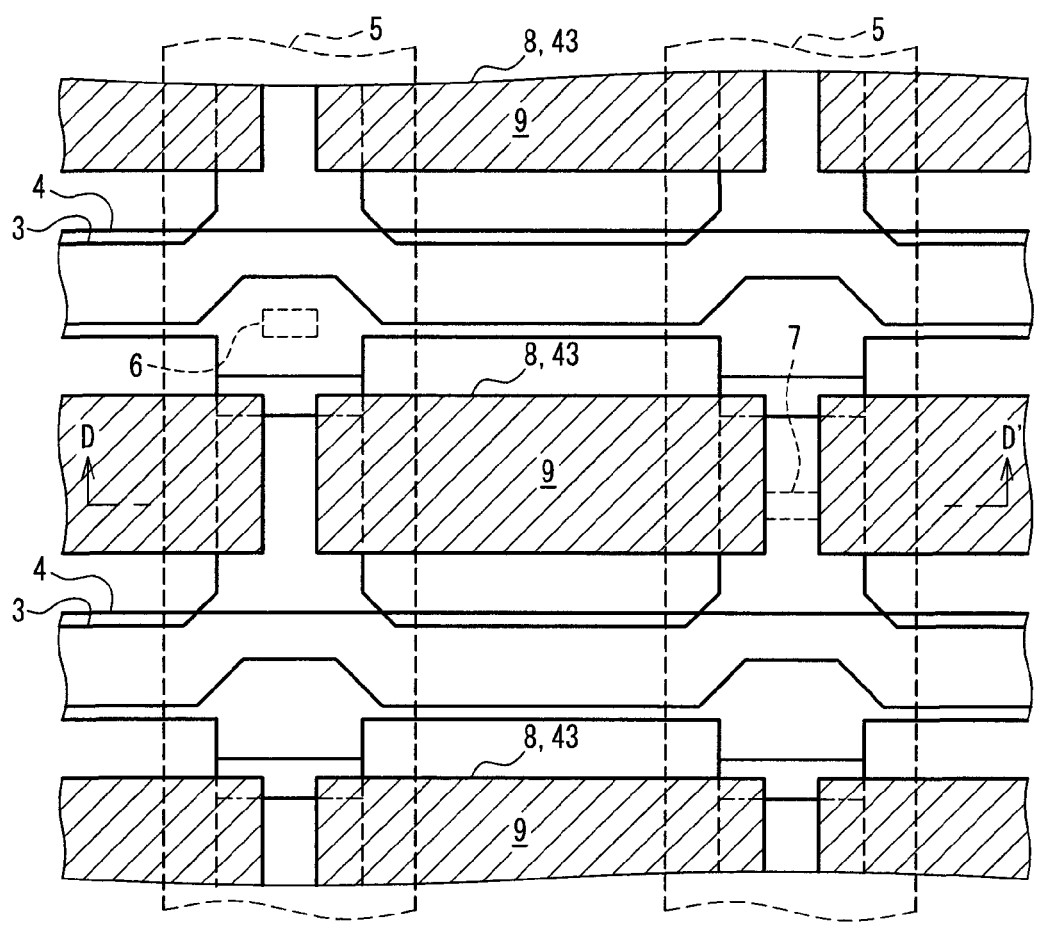
FIG. 19 is a plan view showing a configuration of a pixel and its periphery of a solid-state imaging device according to a first example of Embodiment 5 of the present invention.
Figure 20:
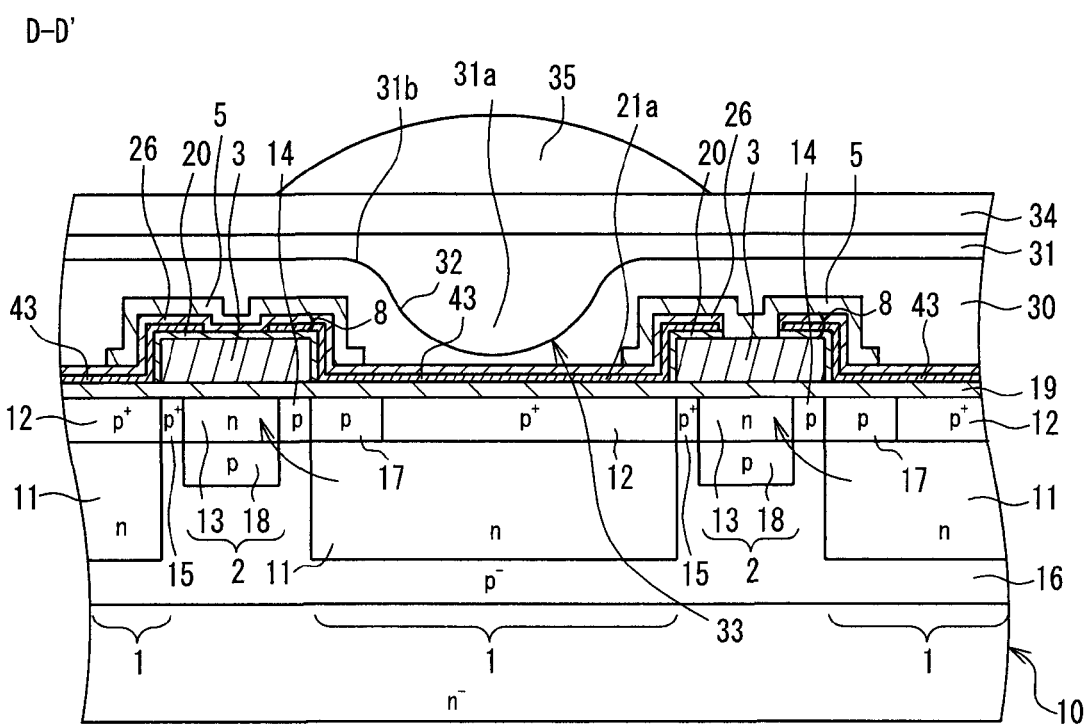
FIG. 20 is a cross-sectional view taken on line D-D' of FIG. 19.

Next, a solid-state imaging device according to Embodiment 5 of the present invention and its manufacturing steps will be described below with reference to FIGS. 19 to 23. Initially, a specific configuration of the solid-state imaging device of Embodiment 5 will be described with reference to FIGS. 19 and 20. FIG. 19 is a plan view showing a configuration of a pixel and its periphery of a solid-state imaging device according to a first example of Embodiment 5 of the present invention. FIG. 20 is a cross-sectional view taken on line D-D' of FIG. 19.

In FIG. 19, the shade film 5 is shown in broken line, and the regions for forming the thick part 8 and the partial insulation film 43 are hatched. Moreover, in FIG. 19, description of insulating members except for the partial insulation film 43 is omitted. Further, in FIG. 20, the hatching of the inside of the semiconductor substrate 10 and the upper layer of the shade film 5 is omitted.

As shown in FIGS. 19 and 20, also in Embodiment 5, a partial insulation film 43 is formed not only in a region where the shade film 5 is overlapped, but also in other regions where the photoreceptive region 9 of the photodiode part 1 is overlapped, similarly to Embodiment 4.

It should be noted that, in Embodiment 5, the partial insulation film 43 further spreads from the photoreceptive region 9 to a region on a pixel isolation side of the photodiode part 1 of which the photoreceptive region 9 is covered. In this point, the solid-state imaging device of Embodiment 5 is different from the solid-state imaging device of Embodiment 4. Except for this point, the solid-state imaging device of Embodiment 5 is configured similarly to the solid-state imaging device of Embodiment 4.

As described above, in Embodiment 5, the silicon nitride film serving as the partial insulation film 43 is formed further on the pixel isolation side of the photodiode part 1. Thus, variations of the sensitivity of the respective photodiode parts 1 in the horizontal direction can be suppressed. Incidentally, the thickness of the partial insulation film 43 may be set similarly to that of the partial insulation film 40 of Embodiment 4.

The manufacturing steps of the solid-state imaging device according to Embodiment 5 will be described with reference to FIGS. 21 and 22. FIGS. 21 and 22 are cross-sectional views showing a method for manufacturing the solid-state imaging device according to a first example of Embodiment 5 of the present invention. FIGS. 21A to 21D respectively show a sequence of main manufacturing steps. FIGS. 22A to 22C respectively show a sequence of main manufacturing steps that are performed after the step shown in FIG. 21D.

Figure 21A:
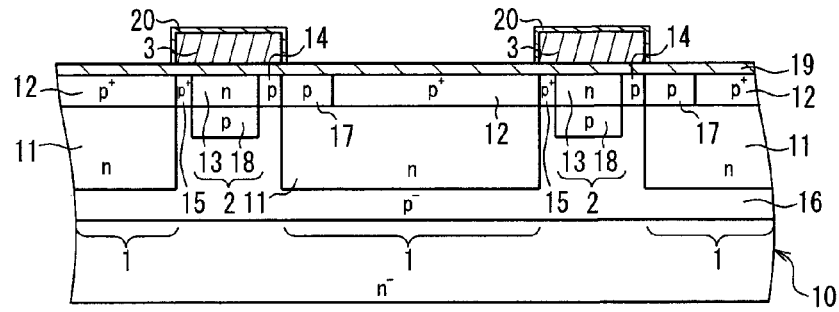
FIGS. 21A to 21D respectively show a sequence of main manufacturing steps.

Initially, as shown in FIG. 21A, a step that is similar to the step shown in FIG. 4A in Embodiment 1 is carried out. Thereby, the respective semiconductor regions, the second vertical transfer electrode 3 and the first vertical transfer electrode 4 (not illustrated in FIG. 21) are formed. Moreover, on the upper surface and the lateral surfaces of the second vertical transfer electrode 3, the insulation film (silicon oxide film) 20 is formed by thermal oxidation. Also on the upper surface and the lateral surfaces of the first vertical transfer electrode 4, the insulation film (not illustrated in FIG. 21) is formed.

Figure 21B:
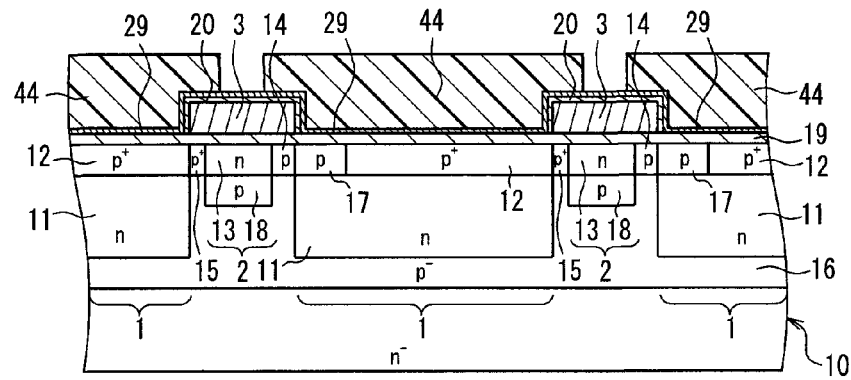
Figure 22A:
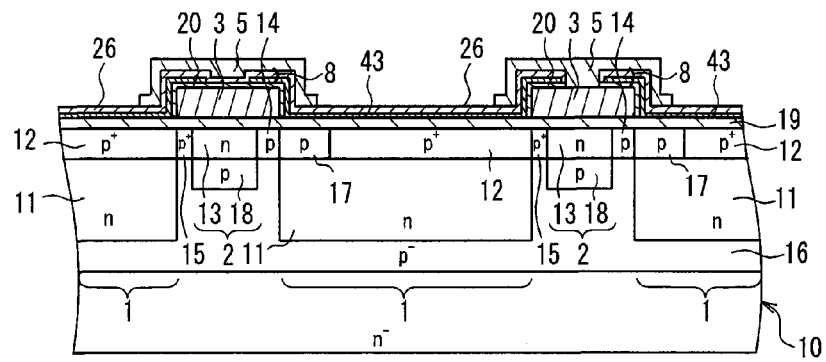
FIGS. 22A to 22C respectively show a sequence of main manufacturing steps that are performed after the step shown in FIG. 21D.
Figure 22B:
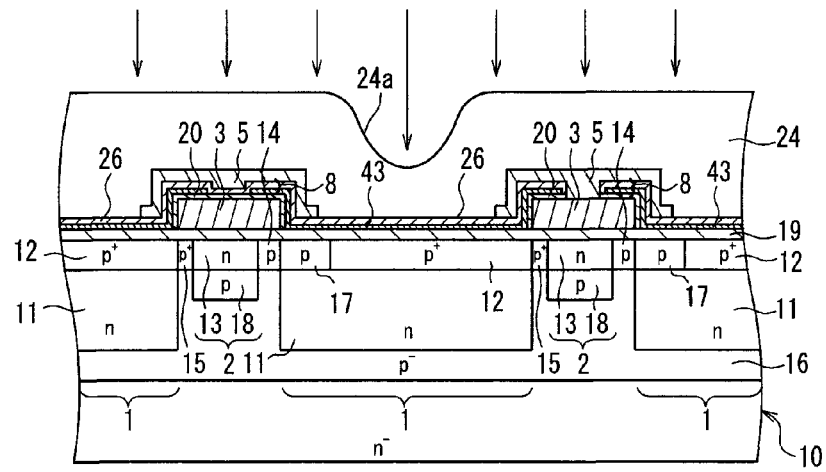
Figure 22C:
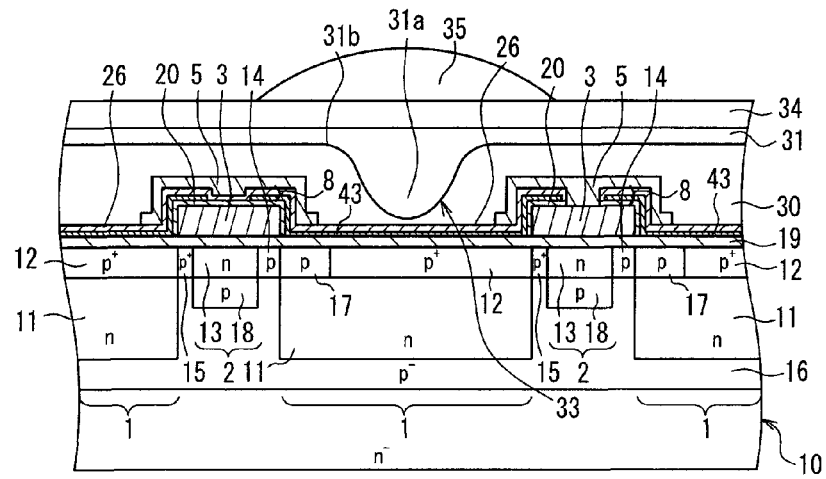

Next, as shown in FIG. 21B, a step that is similar to the step shown in FIG. 10B in Embodiment 3 is carried out. Thereby, the silicon nitride film 29 that covers the entire upper surface of the semiconductor substrate 10 including the second vertical transfer electrode 3 and the first vertical transfer electrode 4 is formed.

Thereafter, a resist pattern 44 is formed as shown in FIG. 21B, but a pattern shape of the resist pattern 44 is different from the pattern shape of the resist pattern shown in FIG. 10B or FIG. 14B. The resist pattern 44 is formed so as to cover the photoreceptive region 9 (see FIG. 19) and regions on both sides of the photoreceptive region 9.

Figure 21C:
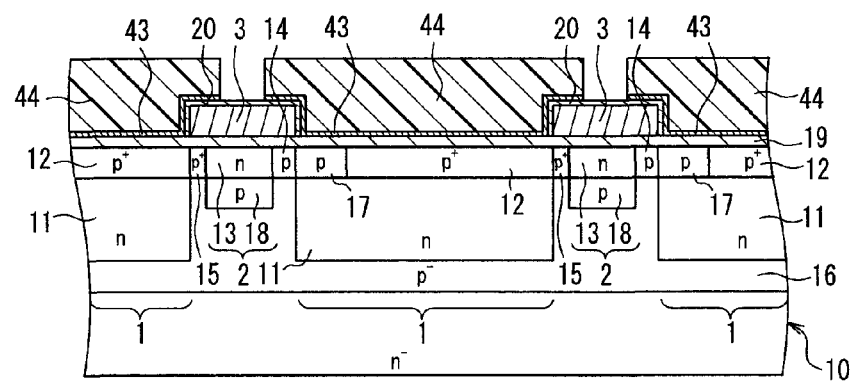

Next, as shown in FIG. 21C, the silicon nitride film 29 is etched until a part of the silicon nitride film 29 where the resist pattern 44 does not cover is removed completely. The etching in this case also is the wet etching using phosphoric acid, similarly to the step shown in FIG. 10C in Embodiment 3. Also in this step, the loss of the film thickness of the insulation film 20 caused by the etching is suppressed.

Figure 21D:
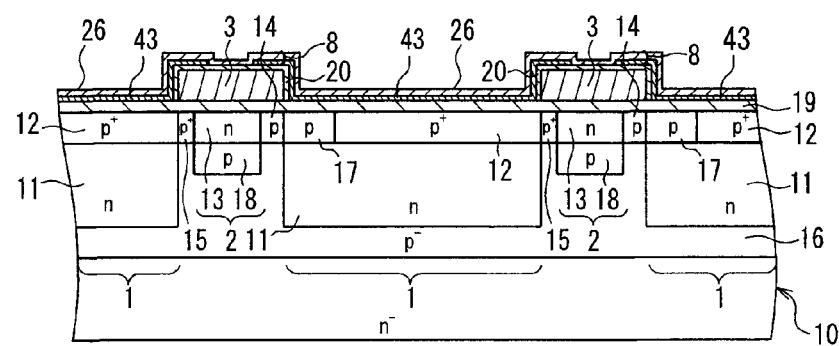

Next, as shown in FIG. 21D, the resist pattern 44 is removed, and subsequently, the insulation film 26 that covers the entire upper surface of the semiconductor substrate 10 including the second vertical transfer electrode 3 and the first vertical transfer electrode 4 is formed. This step is similar to the step shown in FIG. 10D in Embodiment 3, and the insulation film 26 is a silicon oxide film.

In Embodiment 5, the thick part 8 is formed by the steps shown in FIGS. 21B to 21D. Also in Embodiment 5, the variations of the film thickness of the thick part 8 are suppressed similarly to Embodiments 3 and 4, so that the image quality of the shot image can be improved stably.

Next, as shown in FIG. 22A, the shade film 5 is formed. The step shown in FIG. 22A is similar to the step shown in FIG. 4D in Embodiment 1. Next, as shown in FIG. 22B, the insulation film 24 that will become the underlying insulation layer 30 is formed by the formation of the BPSG film and the reflowing by the heat treatment, and is etched, thereby completing the underlying insulation layer 30 (see FIG. 22C). Thereafter, as shown in FIG. 22C, the lens formation layer 31, the color filter 34 and the microlens 35 are formed in this order so as to obtain the solid-state imaging device of Embodiment 5.

Incidentally, the step shown in FIG. 22B is similar to the step shown in FIG. 5A in Embodiment 1. Moreover, the step shown in FIG. 22C is similar to the step shown in FIG. 5B in Embodiment 1.

Figure 23:
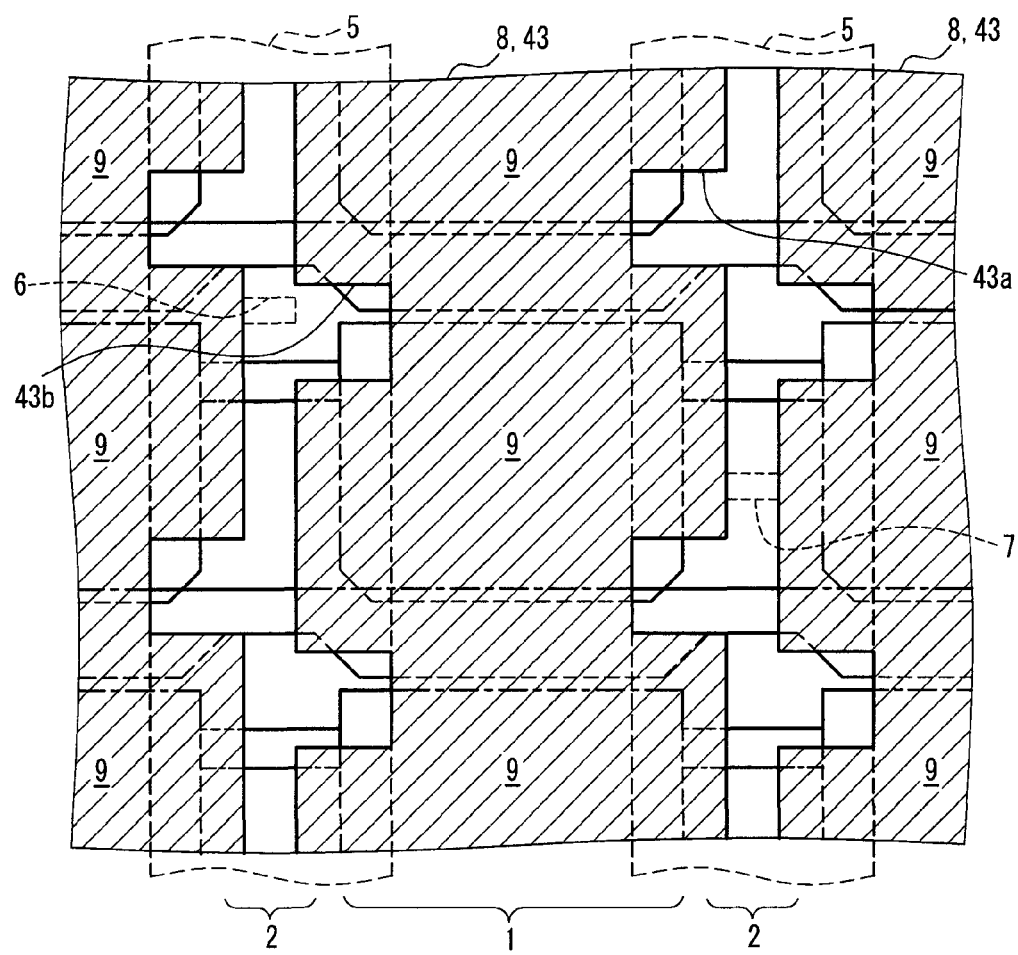
FIG. 23 is a plan view showing a configuration of a pixel and its periphery of a solid-state imaging device according to a second example of Embodiment 5 of the present invention.

Next, a solid-state imaging devices according to a second example of Embodiment 5 will be described with reference to FIG. 23. FIG. 23 is a plan view showing a configuration of a pixel and its periphery of the solid-state imaging device according to the second example of Embodiment 5 of the present invention.

As shown in FIG. 23, in the second example, the partial insulation film 43 is formed such that the outer shape of the thick part 8 is a strip shape extending in the vertical direction, when the thick part 8 is seen from the upside of the semiconductor substrate 10 (see FIG. 13). Moreover, the partial insulation film 43 covers the region between the photodiode parts 1 that are adjacent to each other in the vertical direction.

Thus, similarly to the second example of Embodiment 4, the second example of Embodiment 5 can suppress the generation of the residue of etching 119 (see FIG. 28), in a region where the second vertical transfer electrode 3 and the first vertical transfer electrode 4 are overlapped with each other in the normal line direction of the semiconductor substrate 10, on the intersection of the wall surface and the plane surface formed of the insulation film 26 that is positioned outermost in the laminate thereof.

Moreover, as shown in FIG. 23, in the second example of Embodiment 5, the partial insulation film 43 is formed such that the outer shape of the thick part 8 has notches 43a and 43b on its periphery, similarly to the third example of Embodiment 4. Thus, also in this case, the window for introducing hydrogen at the time of hydrogen sintering (heat treatment) is secured, regardless of whether a positional displacement of the partial insulation film 43 occurs in the vertical direction or in the horizontal direction due to the positional displacement of the mask in the formation step (see FIG. 21B). Also in the case of adopting the second example of Embodiment 5, since the hydrogen sintering can be carried out reliably, similarly to the third example of Embodiment 4, the generation of a dark current can be suppressed stably.

Figure 31:
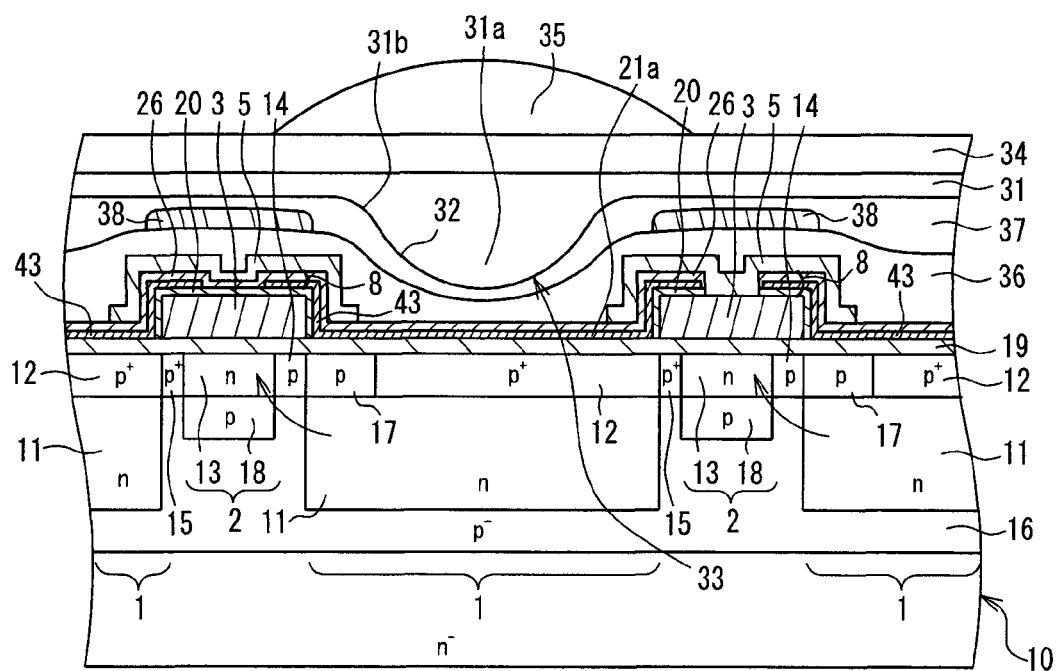
FIG. 31 is a cross-sectional view showing a configuration of a pixel and its periphery of a solid-state imaging device according to a third example of Embodiment 5 of the present invention.

Moreover, also in Embodiment 5, the configuration of the lens element 33 can be similar to that in Embodiment 2. FIG. 31 is a cross-sectional view showing a configuration of a pixel and its periphery of a solid-state imaging device according to a third example of Embodiment 5 of the present invention.

As shown in FIG. 31, also in Embodiment 5, the step difference adjusting film 38 and the intermediate layer 37 can be formed on the underlying insulation layer 36 that covers the shade film 5, similarly to Embodiment 2. The concave curved surface part 32 is formed in the intermediate layer 37. Then, the lens formation layer 31 is formed on the intermediate layer 37, thereby obtaining the lens element 33.

Also in Embodiment 5, if adopting the case shown in FIG. 31, the curvature of the lens element 33 can be set more freely, by setting not only the condition for forming the BPSG film but also the thickness and the size of the step difference adjusting film 38 as appropriate. Thus, the curvature of the lens element 33 can be optimized easily, so that the sensitivity can be improved further.

The invention may be embodied in other specific forms without departing from the spirit or essential characteristics thereof The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A solid-state imaging device comprising:
  a plurality of photodiode parts, each of which converts incident light into a signal charge;
  a plurality of vertical charge transfer parts, each of which reads out the signal charge from the photodiode part and transfers the signal charge in a vertical direction; and
  a plurality of shade films that have conductivity and respectively shade the vertical charge transfer part from the incident light,
  the solid-state imaging device supplying a transfer pulse to the vertical charge transfer part via the shade film,
  wherein the plurality of the photodiode parts are provided on a semiconductor substrate and are arranged in matrix,
  each of the plurality of the vertical charge transfer parts comprises a transfer channel that is provided along a vertical column of the plurality of the photodiode parts in the semiconductor substrate, and a plurality of transfer electrodes that are provided on the transfer channel so as to cross the transfer channel,
  each of the plurality of the shade films is formed above each of the corresponding vertical charge transfer parts via an insulation layer that insulates the shade film from the transfer electrodes,
  the insulation layer has a thick part in a part of the insulation layer where the shade film is overlapped on a side of the photodiode part that is a subject to be read out by the vertical charge transfer part shaded by the shade film, and a lens element that is convex downwards is provided above the plurality of the photodiode parts, for each of the plurality of the photodiode parts or each of the vertical columns of the plurality of the photodiode parts.

2. The solid-state imaging device according to claim 1, wherein the insulation layer comprises a single insulation film that has a first part and a second part whose thickness is larger than a thickness of the first part, and the second part serves as the thick part.

3. The solid-state imaging device according to claim 1, wherein the insulation layer comprises a first insulation film and a second insulation film, the first insulation film is formed in a region where the shade film is overlapped on the side of the photodiode part that is the subject to be read out by the vertical charge transfer part shaded by the shade film, the second insulation film is formed so as to cover the first insulation film, and the first insulation film and a part of the second insulation film where the first insulation film is overlapped serve as the thick part.

4. The solid-state imaging device according to claim 3, wherein the first insulation film is a silicon nitride film, and is formed so as to cover a photoreceptive region of the photodiode part that is the subject to be read out by the vertical charge transfer part shaded by the shade film.

5. The solid-state imaging device according to claim 4, wherein the first insulation film is formed also on a pixel isolation side of the photodiode part of which photoreceptive region is covered with the first insulation film.

6. The solid-state imaging device according to claim 4, wherein the first insulation film is formed such that an outer shape of the thick part is a strip shape extending in the vertical direction when the thick part is seen from an upside of the semiconductor substrate, and covers a region between the photodiode parts that are adjacent to each other in the vertical direction.

7. The solid-state imaging device according to claim 6, wherein the outer shape of the thick part is a strip shape with a notch on a periphery.

8. The solid-state imaging device according to claim 1 further comprising: an underlying insulation layer that covers an upper surface of the semiconductor substrate including the plurality of the shade films; and a lens formation layer that is formed above the underlying insulation layer, wherein the underlying insulation layer is provided with a plurality of concave curved surface parts of the underlying insulation layer at positions where the plurality of the photodiode parts are overlapped, the lens formation layer is provided with a convex part that conforms to the plurality of the concave curved surface parts, and the convex part functions as the lens element.

9. The solid-state imaging device according to claim 8, wherein a step difference adjusting film is formed in a region where the shade film is overlapped on the underlying insulation layer, an intermediate layer is formed so as to cover the step difference adjusting film, and the lens formation layer is formed on the intermediate layer.

10. The solid-state imaging device according to claim 8, wherein an insulation layer that covers an upper surface of the semiconductor substrate including the plurality of the shade films is formed, and is etched so as to form the underlying insulation layer.

* * * * *